(12) United States Patent
Park

(10) Patent No.: US 9,374,101 B2
(45) Date of Patent: Jun. 21, 2016

(54) SENSOR DEVICE INCLUDING HIGH-RESOLUTION ANALOG TO DIGITAL CONVERTER

(71) Applicant: ELECTRONICS AND TELECOMMUNICATIONS RESEARCH INSTITUTE, Daejeon (KR)

(72) Inventor: Ji Man Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/863,398

(22) Filed: Sep. 23, 2015

(65) Prior Publication Data

US 2016/0112057 A1    Apr. 21, 2016

(30) Foreign Application Priority Data

Oct. 21, 2014  (KR) .......................... 10-2014-0142557
Jan. 15, 2015  (KR) .......................... 10-2015-0007297

(51) Int. Cl.
*H03M 1/12*  (2006.01)
*H03M 1/00*  (2006.01)

(52) U.S. Cl.
CPC ............... *H03M 1/002* (2013.01); *H03M 1/12* (2013.01)

(58) Field of Classification Search
CPC ................................. H03M 1/002; H03M 1/12
USPC .......................................... 341/155, 158, 172
See application file for complete search history.

(56) References Cited

U.S. PATENT DOCUMENTS

| 7,583,219 | B2 | 9/2009 | Jeon et al. | |
| 7,788,977 | B2* | 9/2010 | Nagata | G01C 19/56 73/504.12 |
| 7,990,305 | B2 | 8/2011 | Park et al. | |
| 8,098,148 | B2 | 1/2012 | Park et al. | |
| 8,253,615 | B2* | 8/2012 | Hsu | H03M 1/60 341/155 |
| 2010/0066582 | A1 | 3/2010 | Park | |
| 2010/0208114 | A1 | 8/2010 | Kwon et al. | |
| 2010/0289625 | A1 | 11/2010 | Park et al. | |
| 2010/0315194 | A1 | 12/2010 | Park et al. | |
| 2014/0354460 | A1 | 12/2014 | Park et al. | |

FOREIGN PATENT DOCUMENTS

| JP | 2011-097269 A | 5/2011 |
| KR | 10-2008-0035939 A | 4/2008 |
| KR | 10-2008-0052270 A | 6/2008 |
| KR | 10-2008-0053165 A | 6/2008 |
| KR | 10-2010-0041649 A | 4/2010 |
| KR | 10-2010-0092771 A | 8/2010 |
| KR | 10-2014-0139857 A | 12/2014 |
| WO | WO 2007/066981 A1 | 6/2007 |
| WO | WO 2008/048024 A1 | 4/2008 |
| WO | WO 2008/069466 A1 | 6/2008 |

* cited by examiner

Primary Examiner — Khai M Nguyen

(57) ABSTRACT

Provided is a sensor device including: a sensor unit converting a voltage of a periodically switched capacitor into a pulse signal by referring to a clock signal to provide the pulse signal as a first sensing signal; and a high-resolution analog to digital converter (ADC) amplifying a period of the first sensing signal $2^n$ times (n is an integer), amplifying a period of the clock signal $2^{n-1}$ times, and generating a second sensing signal where a switching time of the capacitor is removed by removing the amplified clock signal from the amplified first sensing signal.

20 Claims, 19 Drawing Sheets

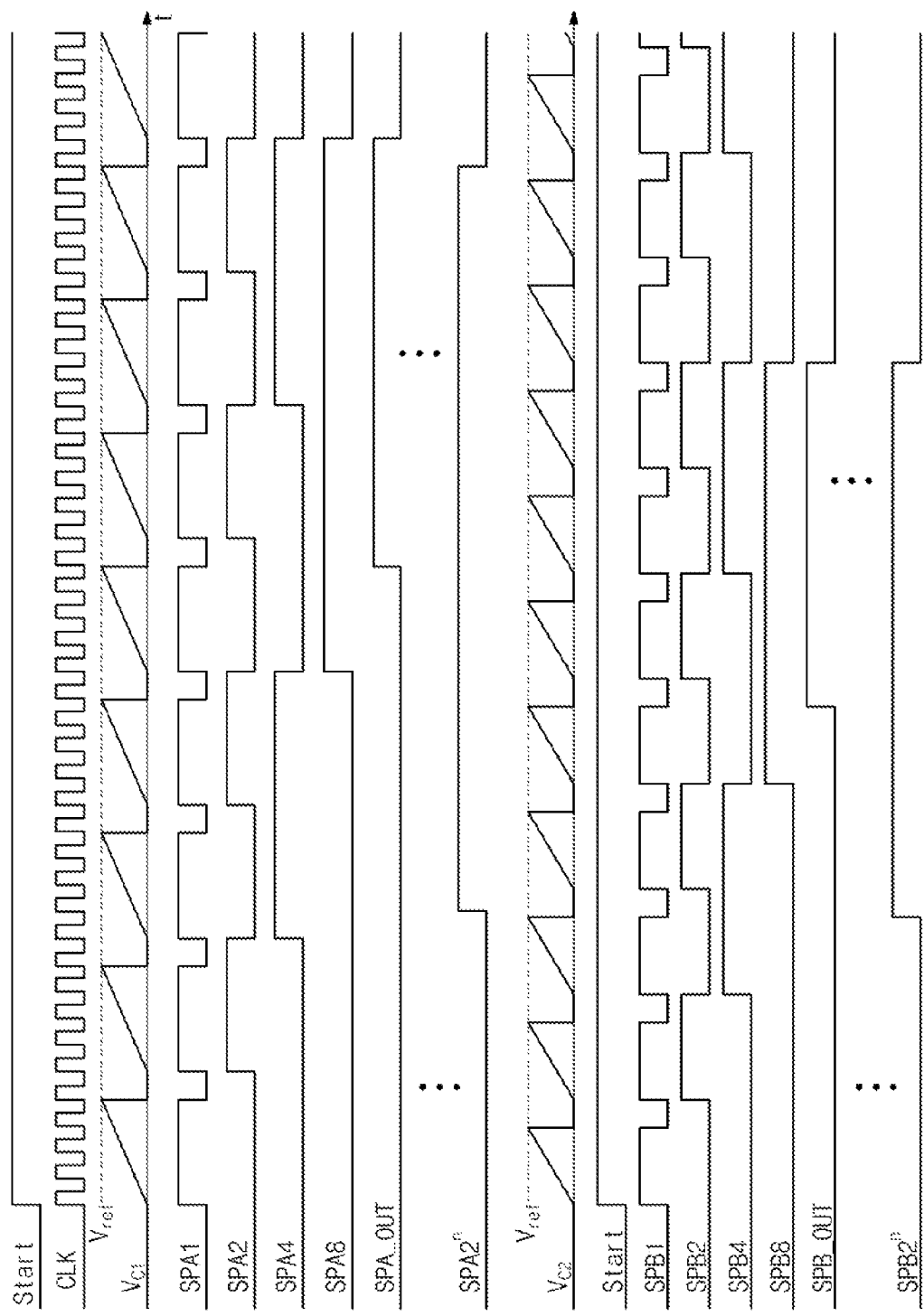

SENSOR DEVICE INCLUDING HIGH-RESOLUTION ANALOG TO DIGITAL CONVERTER

CROSS-REFERENCE TO RELATED APPLICATIONS

This U.S. non-provisional patent application claims priority under 35 U.S.C. §119 of Korean Patent Application Nos. 10-2014-0142557, filed on Oct. 21, 2014, and 10-2015-0007297, filed on Jan. 15, 2015, the entire contents of which are hereby incorporated by reference.

BACKGROUND OF THE INVENTION

The present invention disclosed herein relates to a sensor, and more particularly, to a sensor device including an analog to digital converter converting a sensed signal into a high-resolution digital signal.

An analog to digital converter (ADC) is a device or circuit for converting an analog signal into a digital signal. The ADC may quantize an analog signal outputted from an analog front end to convert the quantized analog signal into digital data. Accordingly, the ADC may be widely used for a terminal for mobile communication, a base station, a digital camera, a semiconductor device, a sensor, and so on.

In general, a double integral ADC using an operational amplifier (OP-AMP) or a successive approximation register (SAR) ADC is used as the ADC. In order to implement an ADC with a semiconductor chip, OP-AMPs or a plurality of capacitor devices are used. Accordingly, the size of an ADC becomes greater relatively and the increase of its power consumption is inevitable. Accordingly, there are still many issues to apply an ADC to a system or device that requires low power consumption and miniaturization such as a mobile device and internet of things (IoT).

SUMMARY OF THE INVENTION

The present invention provides an analog to digital converter reducing power consumption and a sensor device including the same.

The present invention also provides a high-resolution analog to digital converter and a sensor device including the same.

The present invention also provides an analog to digital converter minimizing an occupied chip area and a sensor device including the same.

Embodiments of the present invention provide sensor devices including: a sensor unit converting a voltage of a periodically switched capacitor into a pulse signal by referring to a clock signal to provide the pulse signal as a first sensing signal; and a high-resolution analog to digital converter (ADC) amplifying a period of the first sensing signal $2^n$ times (n is an integer), amplifying a period of the clock signal $2^{n-1}$ times, and generating a second sensing signal where a switching time of the capacitor is removed by removing the amplified clock signal from the amplified first sensing signal.

In some embodiments, the sensor unit may include: a first current source providing a charging current for charging the capacitor; a switch discharging the capacitor according to a switch control signal provided from the high-resolution ADC; and a comparator comparing the voltage of the capacitor with a reference voltage to output a comparison result as the first sensing signal.

In other embodiments, the capacitor may include a variable capacitance capacitor varying according to an external physical/chemical change.

In still other embodiments, the sensor unit may include: a second current source providing the reference voltage; and a variable resistor providing the reference voltage according to a current provided from the second current source, wherein the capacitor may be provided as a fixed capacitance capacitor and the variable resistor may vary according to an external physical/chemical change.

In even other embodiments, the sensor unit may include a current mode ramp integrator converting a capacitor voltage generated when charging and discharging the capacitor with a reference current into a pulse signal.

In yet other embodiments, the high-resolution ADC may include: a pulse divider outputting the first sensing signal amplified by dividing the first sensing signal $2^n$ times (n is an integer); a clock divider generating a clock signal amplified by dividing a pulse width of the clock signal $2^{n-1}$ times; and a signal subtractor removing a switching time from the amplified first sensing signal by using the amplified clock signal.

In further embodiments, the sensor devices may further include a NAND gate performing AND operation on the amplified first sensing signal and the clock signal to provide an AND operation result to the clock divider.

In still further embodiments, the signal subtractor may include an RS flip flop having a set input terminal receiving the amplified clock signal and a reset input terminal receiving the amplified inverted first sensing signal.

In even further embodiments, the sensor devices may further include a counter counting a pulse width of a second sensing signal where a switching time outputted from the signal subtractor is removed to output the counted pulse width as sensing data.

In yet further embodiments, the sensor devices may further include: a D flip flop storing the first sensing signal in synchronization with a rise edge of the clock signal; and a NAND gate performing AND operation on a negative output terminal of the D flip flop and a start signal to provide an AND operation result as the switch control signal.

In yet further embodiments, the sensor unit may include: a first current source providing a charging current for charging the capacitor; a switch discharging the capacitor according to a switch control signal provided from the high-resolution ADC; and a buffer outputting the voltage of the capacitor as the first sensing signal that is a pulse signal.

In other embodiments of the present invention, sensor devices include: first sensor unit periodically charging and discharging a first capacitor by referring to a clock signal and converting a voltage of the first capacitor into a pulse signal to provide the pulse signal as a first sensing signal; a second sensor unit periodically charging and discharging a second capacitor by referring to the clock signal and converting a voltage of the second capacitor into a pulse signal to provide the pulse signal as a second sensing signal; a first high-resolution analog to digital converter (ADC) amplifying a pulse width of the first sensing signal specific times; a second high-resolution ADC amplifying a pulse width of the second sensing signal the specific times; a first counter converting an output of the first high-resolution ADC as first sensing data; a second counter converting an output of the second high-resolution ADC as second sensing data; and a subtractor removing common mode data of the first sensing data and the second sensing data.

In some embodiments, the sensor devices may further include: a first clock divider amplifying a pulse width of the clock signal the half of the specific times to provide the amplified pulse width as a first clock signal; a first RS flip flop removing a pulse width of the first clock signal from the amplified first sensing signal to provide a removal result to the first counter; a second clock divider amplifying a pulse width of the clock signal the half of the specific times to provide the amplified pulse width as a second clock signal; and a second RS flip flop removing a pulse width of the second clock signal from the amplified second sensing signal to provide a removal result to the second counter.

In still other embodiments of the present invention, sensor devices include: a sensor unit periodically charging and discharging a capacitor by referring to a clock signal and converting a voltage of the capacitor into a pulse signal to provide the pulse signal as a first sensing signal; and a micro control unit performing a high-resolution analog to digital conversion function to amplify a pulse width of the first sensing signal target times, amplify a pulse width of the clock signal the half of the target times, and remove a component corresponding to a discharging time of the capacitor voltage by removing a pulse width of the half-target-times amplified clock signal from the target times amplified first sensing signal to output a removal result as a second sensing signal.

In some embodiments, the sensor unit may include: a first current source providing a charging current for charging the capacitor; a switch discharging the capacitor according to a switch control signal provided from the micro control unit; and a comparator comparing the voltage of the capacitor with a reference voltage to output a comparison result as the first sensing signal.

In other embodiments, the capacitor may include a variable capacitance capacitor.

In still other embodiments, the sensor unit may include: a second current source providing the reference voltage; and a variable resistor providing the reference voltage according to a current provided from the second current source, wherein the capacitor may be provided as a fixed capacitance capacitor.

In even other embodiments, the sensor unit may include a current mode ramp integrator converting a capacitor voltage generated when the capacitor is charged and displayed with a reference current into a pulse signal.

In yet other embodiments, the sensor devices may further include a memory providing an algorithm performing the high-resolution analog to digital conversion function to the micro controller unit.

In further embodiments, the sensor unit may output different analog sensing signals through a plurality of channels; and the micro controller unit may select one of the plurality of channels and outputs the selected analog sensing signal as the sensing data.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 14 is a timing diagram illustrating an operation of a differential ADC of FIG. 12A.

DETAILED DESCRIPTION OF PREFERRED EMBODIMENTS

Figure 1:
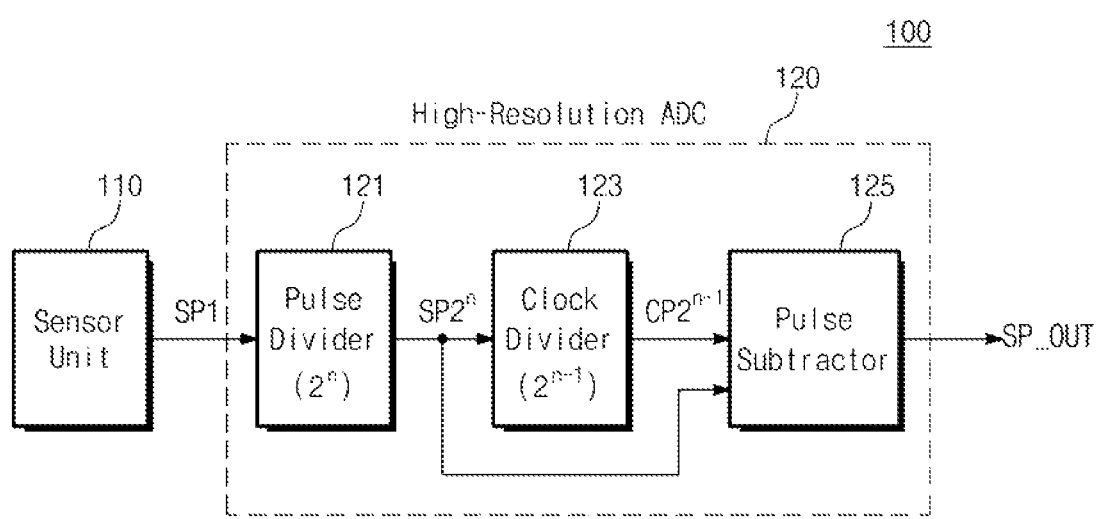
FIG. 1 is a block diagram illustrating a sensor device according to an embodiment of the present invention.

Hereinafter, it will be described in more detail with reference to the accompanying drawings so that those skilled in the art easily carry out the technical idea of the present invention. The same components will be referred to using the same reference numbers. Like components will be referred to using like reference numerals. An analog to digital converter (ADC) described below according to the present invention and operations performed thereby are just exemplary and various changes and modifications are possible within the technical scope of the present invention.

FIG. 1 is a block diagram illustrating a sensor device according to an embodiment of the present invention. Referring to FIG. 1, a sensor device 100 includes a sensor unit 110 and a high-resolution ADC 120.

The sensor unit 110 detects a change of a resistance or a capacitance C varying according to temperature, humidity, or the amount of changes in light and converts the change into electrical signals. The sensor unit 110 may be a current mode ramp integrator outputting the converted electrical signals in the size of a pulse width. Especially, the sensor unit 110 senses the size of a voltage of a capacitance C charged/discharged periodically and contains sensing information in a pulse width to output it as a first sensing signal SP1. At this point, a switching time for charging or discharging of the capacitance C may be inevitably included in the first sensing signal SP1.

It is understood that a configuration or function of the sensor unit 110 is not limited thereto. That is, the sensor unit 110 may include arbitrary sensors for sensing various physical or chemical changes and providing sensed information in a pulse width.

The high-resolution ADC 120 may amplify the first sensing signal SP1 and may remove an amplified portion of a switching time, which is included inevitably in terms of the structure of the sensor unit 110, from the amplified first sensing signal SP1. Accordingly, the high-resolution ADC 120 may remove a signal component corresponding to a switching time that serves as noise, from the high-resolution amplified first sensing signal SP1. Accordingly, the high-resolution ADC 120 may provide a signal conversion of high accuracy and high-resolution. In order to include such a function, the high-resolution ADC 120 may include a pulse divider 121, a clock divider 123, and a pulse subtractor 125.

The pulse divider 121 $2^n$ times-divides the first sensing signal SP1, that is, a pulse signal. Herein, "divide" means dividing a frequency of a pulse signal. Accordingly, $2^n$ times-dividing a pulse means $2^n$ times-increasing the period of a pulse. The increase of the period of a pulse eventually has the meaning of "amplify" that increases the pulse width of a pulse signal. Accordingly, hereinafter, the meaning of dividing a pulse should be understood as amplifying a pulse signal.

The pulse divider 121 $2^n$ times-amplifies the pulse period of the first sensing signal SP1 to generate a pulse divided signal SP$2^n$. For example, when the pulse period of the first sensing signal SP1 is $(T_{P1}+T_{SW})$, the pulse divider 121 amplifies the pulse width to $2^n(T_{P1}+T_{SW})$. Herein, a charging time $(T_{P1})$ means a time for charging the capacitance C (not shown) of the sensor unit 110. Accordingly, the charging time $(T_{P1})$ includes sensing information detected by the sensor unit 110. Then, a switching time $(T_{SW})$ means a time for discharging the capacitance C.

The clock divider 123 amplifies the period of a clock signal CLK 2-1 times than the pulse divider 121. A pulse signal amplified by the pulse divider 121 includes a pulse component corresponding to a switching time $(T_{SW})$ of the sensor unit 110. Then, a component corresponding to such a switching time $(T_{SW})$ may be amplified by the pulse divider 121. The period of the switching time $(T_{SW})$ is finally determined according to a clock signal CLK. Then, the amplified switching time $2^n(T_{SW})$ becomes identical to the pulse width of a signal obtained by amplifying a clock signal CLK. This relationship will be described in more detail through a timing diagram described later.

The pulse subtractor 125 removes a switching time corresponding to $2^n(T_{SW})$ from a pulse divide signal SP$2^n$ of which pulse width is amplified to $2^n(T_{P1}+T_{SW})$ by the clock divider 121. That is, the pulse subtractor 125 may remove a clock signal component not including sensing information from the amplified pulse divide signal SP$2^n$. Then, as its result, the pulse subtractor 125 may output a second sensing signal SP_OUT including only a pure sensing component as a switching time component is removed.

The above-described configuration and function are simplified and illustrated in order to the technical feature of the present invention. Although a clock signal CLK provided to the high-resolution ADC 120 and a switching signal provided to the sensor unit 110 are not shown, their operations will be described in more detail in specific embodiments.

Figure 2:
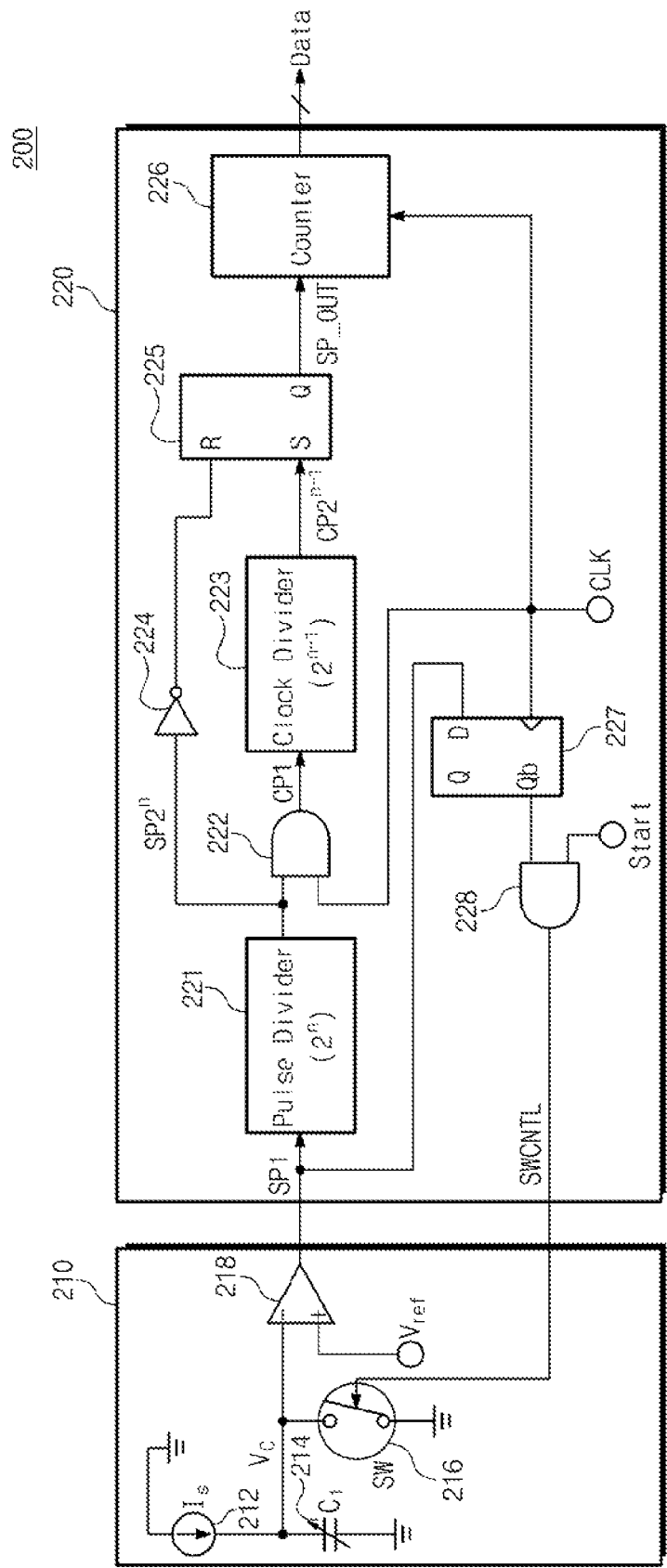
FIG. 2 is a block diagram illustrating a sensor device of FIG. 1 according to an embodiment of the present invention.

FIG. 2 is a block diagram illustrating a sensor device of FIG. 1 in detail according to an embodiment of the present invention. Referring to FIG. 2, a sensor device 200 includes a sensor unit 210 and a high-resolution ADC 220.

The sensor unit 210 may include a current source 212, a sensing capacitor 214, a switch 216, and a comparator 218. The current source 212 may provide a charging current Is of a predetermined level in order to charge the sensing capacitor 214. The sensing capacitor 214 may be charged by the charging current Is. Then, the sensing capacitor 214 may be discharged by the switch 216. The sensing capacitor 214 is provided as a variable capacitance. That is, the sensing capacitor 214 may be provided in a structure in which the size of a capacitance varies according to physical and chemical changes.

The switch 216 may discharge the sensing capacitor 214 in response to a switch control signal SWCNTL. That is, a change in a pattern of a capacitor voltage Vc according to charging of the sensing capacitor 214 is outputted as a sensing result and the switch 216 may initialize the capacitor voltage Vc by discharging the periodic sensing capacitor 214. The comparator 218 compares a capacitor voltage Vc outputted periodically by charging/discharging with a reference voltage Vref. The capacitor voltage Vc is provided to a negative input terminal (−) of the comparator 218 and the reference voltage Vref is provided to a positive input terminal (+) of the comparator 128. Then, the comparator 218 outputs a comparison result as the first sensing signal SP1.

According to the above-mentioned configuration and function, the sensor unit 210 may be configured in a current mode ramp integrator form. That is, the sensing capacitor 214 is charged by a predetermined size of current Is and discharged by the switch 216. Then, the rise and discharging pattern of the capacitor voltage Vc are changed according to a capacitance change of the sensing capacitor 214 and such a sensing result is to be outputted as the pulse width of the first sensing signal SP1.

The high-resolution ADC 220 generates a switch control signal SWCNTL for controlling the sensing unit 210 by using a start signal Start and a clock signal CLK. The high-resolution ADC 220 amplifies the first sensing signal SP1 outputted as a sensing result of the sensor unit 210. Then, the high-resolution ADC 220 removes a pulse portion corresponding to a switching section generated by the switch 216, from the amplified pulse signal. In order for such an operation, the high-resolution ADC 220 may include a pulse divider 221, a first NAND gate 222, a clock divider 223, an inverter 224, an RS flip flop 225, a counter 226, a D flip flop 227, and a second NAND gate 228.

The pulse divider 221 divides the first sensing signal SP1 to have the period of a target resolution (for example, $2^n$ times). That is, the pulse width of the first sensing signal SP1 is amplified $2^n$ times by the pulse divider 221. That is, a pulse divide signal SP$2^n$ obtained by increasing the period of the first sensing signal SP1 $2^n$ times through the pulse divider 221 is outputted. The first sensing signal SP1 includes both a sensing signal component sensed by the sensor unit 210 and a switching signal component for driving the sensor unit 210. As a result, when the first sensing signal SP1 is amplified by the pulse divider 221, both the sensing signal component and the switching signal component are amplified.

The first NAND gate 222 may perform AND operation on the pulse divide signal SP$2^n$ provided from the pulse divider 221 and a clock signal CLK. Then, the first NAND gate 222 may deliver a first clock pulse CP1 provided as the operation result to the clock divider 223. The first clock pulse CP1, that is, an output of the first NAND gate 222, includes a clock signal CLK included in a high section of the pulse divide signal SP$2^n$. A clock signal CLK corresponding to a low section of the pulse divide signal SP$2^n$ is removed from the first clock pulse CP1, that is, an output signal of the first NAND gate 222. The clock divider 223 may amplify a first clock pulse CP1 $2^{n-1}$ times, which is provided from the first NAND gate 222. That is, the pulse width of the first clock pulse CP1, that is, an output signal of the first NAND gate 222, may be increased $2^{n-1}$ times by the clock divider 223. A clock signal is amplified $2^{n-1}$ times by the clock divider 223. As a result, the clock divider 223 may output a clock divide signal CP$2^{n-1}$ obtained by amplifying a clock signal CLK. The inverter 224 inverts a pulse divide signal SP$2^n$ provided from the pulse divider 221.

The RS flip flop 225 receive an inverted pulse divide signal SP$2^n$ through a reset input terminal R and a clock divide signal CP$2^{n-1}$ through a set input terminal S. In relation to the RS flip flop 225, a current output state Q(t) is determined according to a state of the reset input terminal R, a state of the set input terminal S, and a previous output state Q(t−1). A switching time $2^n T_{SW}$ included in a pulse divide signal SP2$^n$ may be removed by the RS flip flop 225. That reason is that the switching time $2^n T_{SW}$ included in the pulse divide signal SP2$^n$ corresponds to the half period of the clock divide signal CP2$^{n-1}$. A second sensing signal SP_OUT obtained by removing the influence of the switching time $2^n T_{SW}$ from the first divide signal CP2$^n$ by the RS flip flop 225 is outputted. Herein, the RS flip flop 225 may have any configuration for removing a pulse width corresponding to the half period of the clock divide signal CP2$^{n-1}$ from the pulse divide signal SP2$^n$. For example, it is apparent to those skilled in the art that the RS flip flop 225 may be configured with an RS latch including a combination circuit not synchronized with a clock.

The counter 226 may count the pulse length of the pulse width amplified second sensing signal SP_OUT including only a pure sensing component and output it as a binary data string. A pulse count operation of the counter 226 is performed based on a basically provided clock signal CLK.

The D flip flop 227 inverts the first sensing signal SP1 in synchronization with a clock signal CLK. The inverted first sensing signal SP1 is inputted to the second NAND gate 228 together with a start signal Start. As a result, the switch 216 of the sensor unit 210 is controlled by an inverted and fed back first sensing signal SP1. However, since the first sensing signal SP1 includes a switching time, the influence of a switching time does not disappear after the feedback.

As above, the sensor device 200 amplifies the first sensing signal SP1 outputted from the sensor unit 210 and removes an unnecessary switching component included in the amplified pulse signal to output it as the second sensing signal SP_OUT. As the second sensing signal SP_OUT is counted, only a pure sensing component from the first sensing signal SP1 may be generated as digital data.

Figure 3:
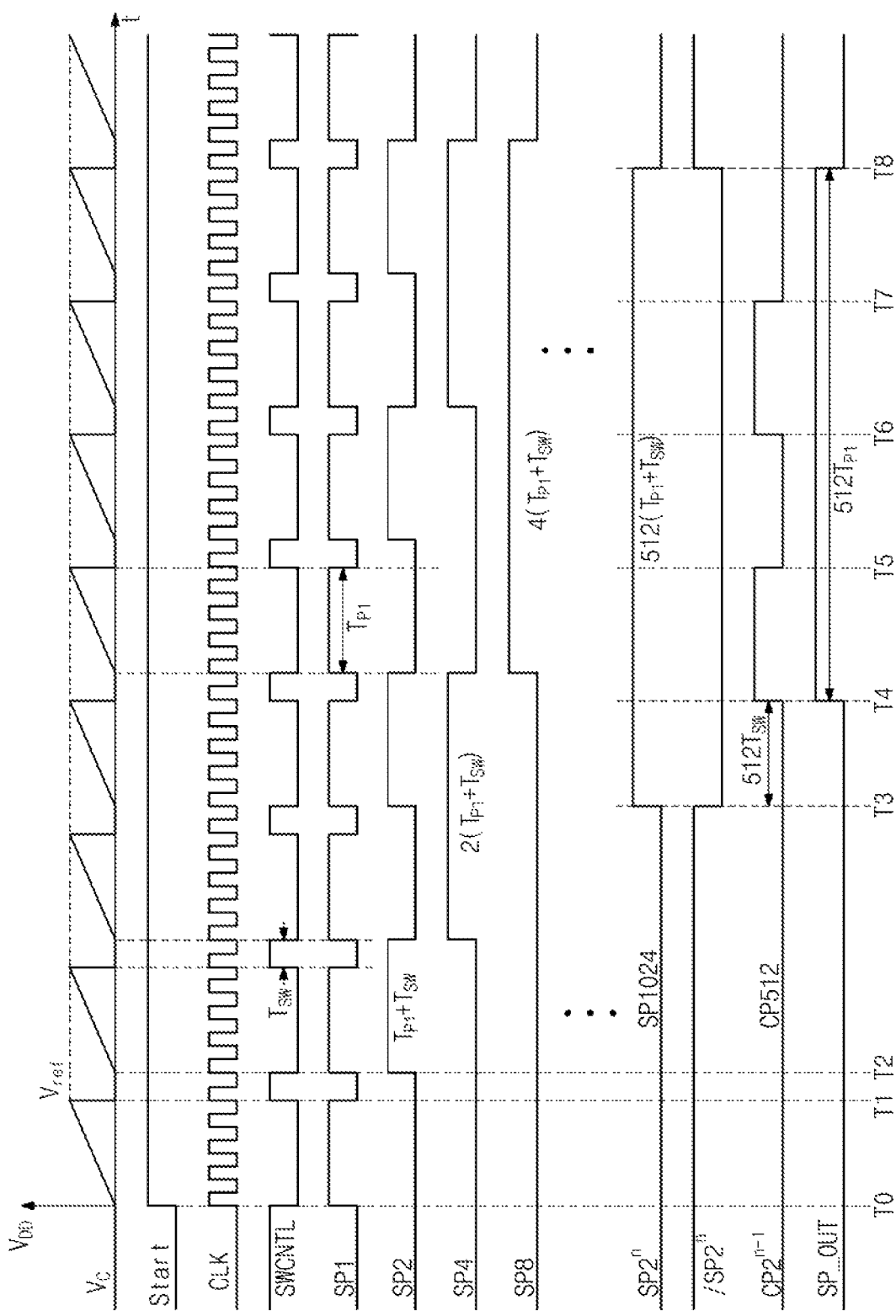
FIG. 3 is a timing diagram illustrating an operation of a high-resolution ADC of FIG. 2.

FIG. 3 is a timing diagram illustrating an operation of the sensor device 200 of FIG. 2. Referring to FIG. 3, the high-resolution ADC 220 amplifies a first sensing signal SP1 outputted from the sensor unit 210 and removes an unnecessary switching component included in the amplified first sensing signal SP1 to output it as a second sensing signal SP_OUT. As the second sensing signal SP_OUT is counted, only a pure sensing signal of the first sensing signal SP1 may be outputted as digital data Data.

First, the sensing capacitor 214 is to be charged and discharged periodically by a source current Is in the sensor unit 210. At the T0 time point, a start signal Start is activated. The sensing capacitor 214 is charged in a section where the switch control signal SWCNTL is outputted in a low level. Accordingly, a capacitor voltage Vc may rise to a predetermined slope. During this section T0 to T1, since the capacitor voltage Vc is lower than a reference voltage Vref, a level of the first sensing signal SP1, that is, an output of the comparator 218, may maintain logic high. On the other hand, at the time point T1, a level of the capacitor voltage Vc reaches the reference voltage Vref. Then, the comparator 218 outputs a first sensing signal SP1 of a logic low level. A logic low section of the first sensing signal SP1 corresponds to one period of a clock signal. That is, since an inverted signal of the first sensing signal SP1 is provided to the switch control signal SWCNTL, the switch 216 is turned on at the section T1 to T2 and the sensing capacitor 214 is discharged. When one period of a clock signal elapses, that is, the switch control signal SWCNTL drops to a low level again at the time point T2. Then, the charging of the sensing capacitor 214 is to start. The operation of the sensor unit 210 will repeat charging-discharging periodically by such a switch control signal SWCNTL. Then, when a capacity of the sensing capacitor 214 is changed by a change in physical and chemical environments, this affects such a period and such influence is reflected on the pulse width of the first sensing signal SP1.

Then, the high-resolution ADC 220 amplifies a first sensing signal SP1. That is, the pulse divider 221 extends the period of the first sensing signal SP1 to target times $2^n$ by using a plurality of flip flops. The first sensing signal SP1 includes both a sensing time TP1 corresponding to a charging section of the sensing capacitor 214 and a switching time $T_{SW}$ unrelated to a sensing time. Accordingly, when a pulse width is amplified by the pulse divider 221, both the sensing time TP1 and the switching time $T_{SW}$ are amplified. Through the pulse divider 221, the first sensing signal SP1 is converted into a pulse divide signal SP2$^n$ of which period is amplified target times $2^n$.

When the pulse divide signal SP2$^n$ is generated by using a plurality of flip flops, 2 times SP2$^1$, four times SP2$^2$, eight times SP2$^3$, ..., 2$^n$ times SP2$^n$ dividing processes are performed on each stage for an inputted first sensing signal SP1. In this case, the switching time $T_{SW}$ is amplified to the same ratio in addition to the amplification of the sensing time TP1 in each stage.

Such the amplification of a pulse width is identically performed by the clock divider 223. However, the clock divider 223 amplifies a clock signal CLK $2^{n-1}$ times in a section corresponding to a high level of the pulse divide signal SP2$^n$. The clock divide signal CP$^{2n-1}$ amplified by the clock divider 223 is outputted in a shown form to a high section of the pulse divide signal SP2$^n$. Herein, it is assumed that n representing divide times is 10.

An inverted pulse divide signal /SP2$^n$ is delivered to a reset input terminal R of the RS flip flop 225 to generate a second sensing signal SP_OUT. Then, a clock divide signal CP$^{2n-1}$ may be provided to a set input terminal S of the RS flip flop 225.

Referring to the time point T3, before the time point T3, a state of a reset input terminal R may maintain logic "1", a set input terminal S may maintain logic "0", and an output terminal Q may maintain logic '0'. However, at the time point T3, the inverted pulse divide signal /SP2$^n$ shifts into logic '0', and as the clock divide signal CP$^{2n-1}$ maintains logic '0', the output terminal Q maintains logic '0'. Accordingly, the second sensing signal SP_OUT may maintain logic '0'.

At the time point T4, a state of the reset input terminal R of the RS flip flop 225 maintains logic '0' and the set input terminal S shifts into logic '1'. Accordingly, at the time point T4, the output terminal Q shifts into logic '1'. Accordingly, the second sensing signal SP_OUT may shift into logic '1'.

At the time point T5, a state of the reset input terminal R of the RS flip flop 225 maintains logic '0' and the set input terminal S shifts into logic '0'. Accordingly, at the time point T5, the output terminal Q maintains logic '1'. Accordingly, the second sensing signal SP_OUT may maintain logic '1'. A state of logic '1' of such the second sensing signal SP_OUT is maintained until the time point T8 where the reset input terminal R shifts into logic '1'.

As a result, it is described that a switching time included in the pulse divide signal SP2$^n$ is removable by the RS flip flop 225. A component of the pulse width amplified switching section $T_{SW} 2^{n-1}$ is removed from the pulse divide signal SP2$^n$ through the clock divide signal CP2$^{n-1}$.

Figure 4:
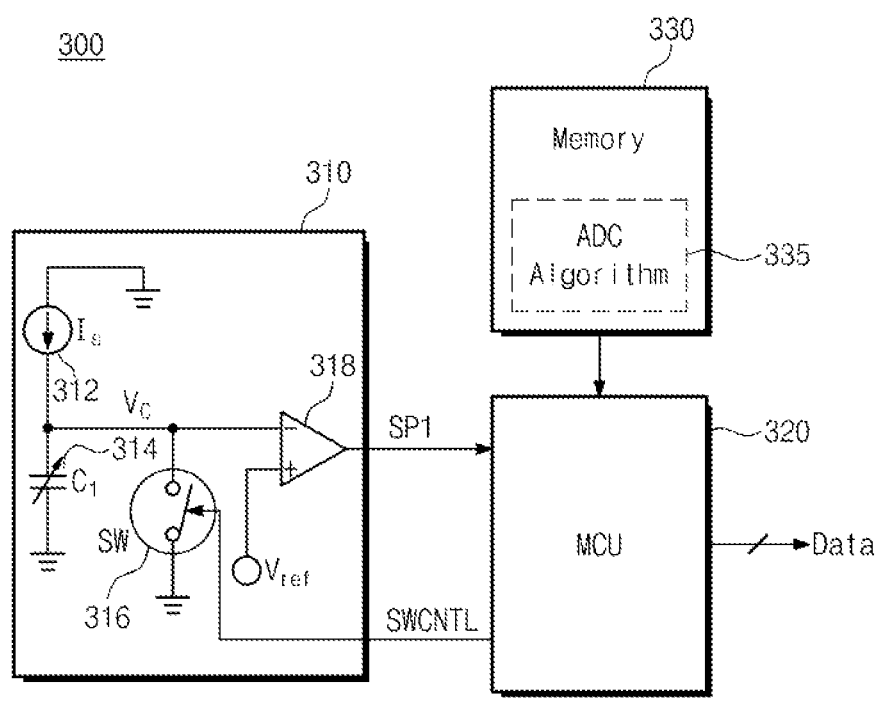
FIG. 4 is a block diagram illustrating a sensor device according to another embodiment of the present invention.

FIG. 4 is a block diagram illustrating a sensor device according to another embodiment of the present invention. Referring to FIG. 4, a sensor device 300 includes a sensor unit 310, a micro controller unit (MCU) 320, and a memory 330 including an ADC algorithm 335.

The sensor unit 310 is substantially identical to the sensor unit 210 shown in FIG. 2. That is, the sensor capacitor 314 is charged by a predetermined size of charging current IS provided from the current source 312. Then, charges charged to the sensor capacitor 314 may be discharged periodically by the switch 316 controlled by a switch control signal SWCNTL. A capacitor voltage Vc formed by periodic charging/discharging of the sensor capacitor 314 is compared to a reference voltage Vref by a comparator 318 and is to be outputted as a first sensing signal SP1, that is, a signal in pulse form. The first sensing signal SP1 in pulse form is provided to the MCU 320.

The MCU 320 converts a first sensing signal SP1 provided from the sensor unit 310 into digital data Data. The MCU 320 may generate a switch control signal SWCNTL for controlling charging/discharging of the sensor unit 320 by referring to the period of a clock signal CLK. The MCU 320 performs a function of the high-resolution ADC 220 described with reference to FIG. 2. That is, the MCU 320 generates a pulse divide signal $SP2^n$ by amplifying the pulse width of the first sensing signal SP1 target times $2^n$. Then, the MCU 320 generates a clock divide signal $CP2^{n-1}$ by amplifying the pulse width of a clock signal CLK $2^{n-1}$ times. The MCU 320 may remove a switching component by removing the clock divide signal $CP2^{n-1}$ from the pulse divide signal $SP2^n$ to remove a switching component.

That is, the MCU 320 may drive an algorithm corresponding to general components of the high-resolution ADC 220 described with reference to FIG. 2. Such an algorithm may be provided through an embedded memory in the MCU 320. Alternatively, the ADC algorithm 335 for performing a function of the high-resolution ADC 220 described with reference to FIG. 2 may be provided from the memory 330 connected to the outside of the MCU 320.

Figure 5:
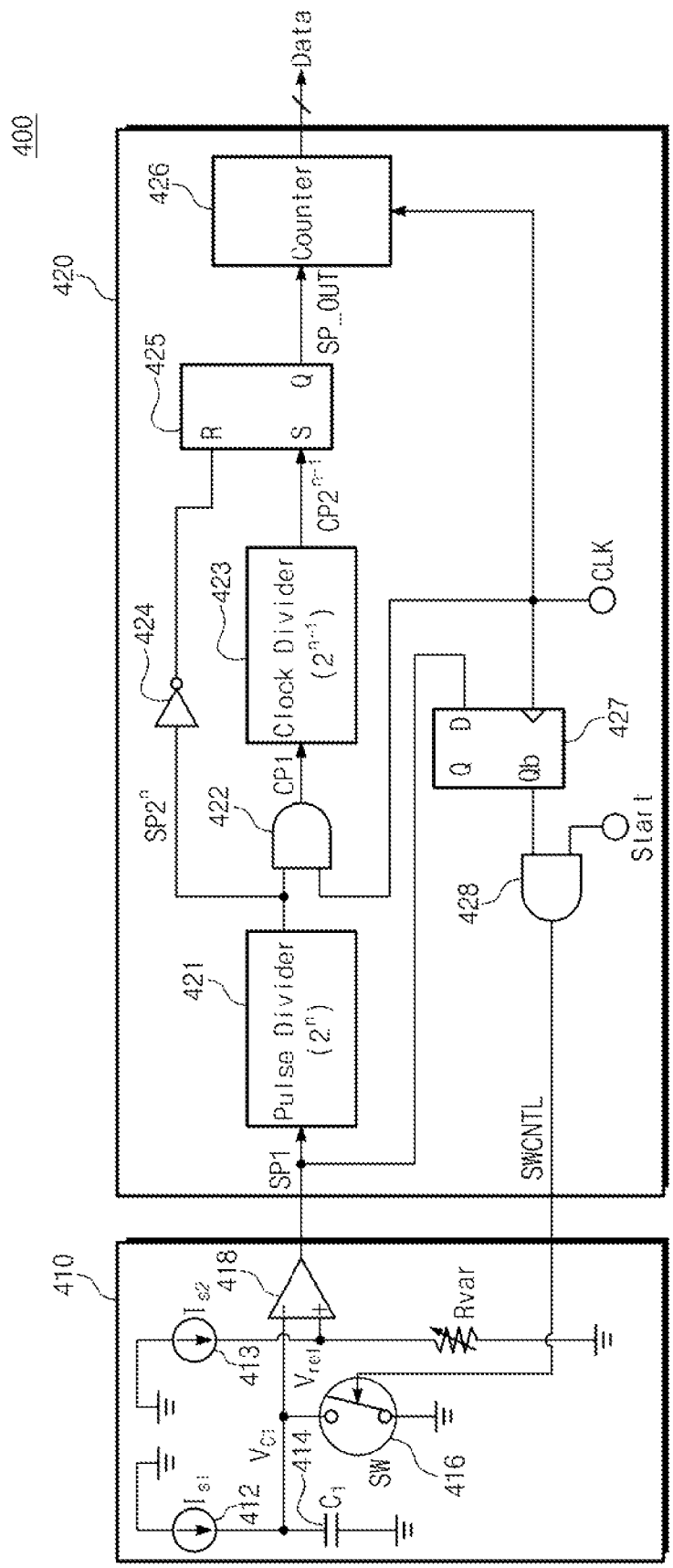
FIG. 5 is a block diagram illustrating a sensor device according to another embodiment of the present invention.

FIG. 5 is a block diagram illustrating a sensor device according to another embodiment of the present invention. Referring to FIG. 5, a sensor device 400 includes a sensor unit 410 including variable resistance and a high-resolution ADC 420.

The sensor unit 410 may include current sources 412 and 413, a charging capacitor 414, a switch 416, a comparator 418, and a variable resistor Rvar. The first current source 412 is provided for charging the charging capacitor 414. The second current source 413 provides a predetermined size of current $I_{S2}$ flowing in the variable resistor Rvar. Accordingly, when the size of the variable resistor Rvar is changed by physical and chemical sensing, as the size of the current $I_{S2}$ is maintained constantly, a reference voltage Vref is changed. A change of the reference voltage Vref is consequently sensed. Herein, the sizes $I_{S1}$ and $I_{S2}$ of currents respectively provided from current sources 412 and 413 may be provided identically. However, it is understood that the sizes $I_{S1}$ and $I_{S2}$ of currents have different values if necessary.

The charging capacitor 414 provides a fixed size of capacitance unlike the sensing capacitor 214 of FIG. 2. The charging capacitor 414 may be charged by the first current source $I_{S1}$. Then, charges charged to the charging capacitor 414 are to be discharged by the switch 416. The length of a charging time may be set according to a capacitance of the charging capacitor 414.

The switch 416 may discharge the charging capacitor 414 in response to a switch control signal SWCNTL. That is, a capacitor voltage Vc is generated according to charging of the charging capacitor 414 and the switch 416 discharges the charging capacitor 414 periodically to initialize a capacitor voltage Vc. The comparator 418 compares a capacitor voltage Vc outputted periodically by charging/discharging of the charging capacitor 414 with a reference voltage Vref. The capacitor voltage Vc is provided to a negative input terminal (−) of the comparator 418 and the reference voltage Vref is provided to a positive input terminal (+) of the comparator 418. Then, the comparator 418 outputs a comparison result as the first sensing signal SP1.

According to the above-mentioned configuration and function, the sensor unit 410 may be configured in a current mode ramp integrator form. That is, the charging capacitor 414 is charged by a predetermined size of current $I_{S1}$ and discharged by the switch 416. Then, the rise and discharge pattern of the capacitor voltage Vc are changed by a change of a reference voltage Vref caused by a size change of the variable resistor Rvar. Such a sensing result may be outputted as the pulse width of the first sensing signal SP1.

The high-resolution ADC 420 may be substantially provided identical to the high-resolution ADC 220 of FIG. 2. The high-resolution ADC 420 generates a switch control signal SWCNTL for controlling the sensing unit 410 by using a start signal Start and a clock signal CLK. The high-resolution ADC 420 amplifies the first sensing signal SP1 outputted as a sensing result of the sensor unit 410. Then, the high-resolution ADC 420 removes a pulse portion corresponding to a switching section generated by the switch 416, from the amplified pulse signal. In order for such an operation, the high-resolution ADC 420 may include a pulse divider 421, a first NAND gate 422, a clock divider 423, an inverter 424, an RS flip flop 425, a counter 426, a D flip flop 427, and a second NAND gate 428.

The pulse divider 421 divides the first sensing signal SP1 to have the period of a target resolution (for example, $2^n$ times). The pulse width of the first sensing signal SP1 is amplified $2^n$ times by the pulse divider 421. That is, the first sensing signal SP1 is amplified $2^n$ times by the pulse divider 421 and is outputted as a pulse divide signal $SP2^n$. The first sensing signal SP1 includes both a sensing signal component sensed by the sensor unit 410 and a switching component for driving the sensor unit 410. As a result, when a pulse width is amplified by the pulse divider 421, both the sensing signal component and the switching component are amplified.

The first NAND gate 422 may perform AND operation on the pulse divide signal $SP2^n$ provided from the pulse divider 421 and a clock signal CLK. Then, the first NAND gate 422 may deliver a first clock pulse CP1 provided as the operation result to the clock divider 423. The first clock pulse CP1, that is, an output of the first NAND gate 422, includes a clock signal CLK included in a high section of the pulse divide signal $SP2^n$.

A clock signal CLK corresponding to a low section of the pulse divide signal $SP2^n$ is removed from the first clock pulse CP1, that is, an output of the first NAND gate 422.

The clock divider 423 divides a first clock pulse CP1 $2^{n-1}$ times, which is provided from the first NAND gate 422. That is, the pulse width of the first clock pulse CP1, that is, an output signal of the first NAND gate 422, may be increased $2^{n-1}$ times by the clock divider 423. A clock signal is amplified $2^{n-1}$ times by the clock divider 423. As a result, the clock divider 423 may output a clock divide signal $CP2^{n-1}$ obtained by amplifying a clock signal CLK. The inverter 424 inverts a pulse divide signal $SP2^n$ provided from the pulse divider 421.

The RS flip flop 425 receive an inverted pulse divide signal $SP2^n$ through a reset input terminal R and a clock divide signal $CP2^{n-1}$ through a set input terminal S. In relation to the RS flip flop 425, a current output state Q(t) is determined according to a state of the reset input terminal R, a state of the set input terminal S, and a previous output state Q(t−1). A switching time $2^n T_{SW}$ included in a pulse divide signal $SP2^n$ may be removed by the RS flip flop 425. That reason is that the switching time $2^n T_{SW}$ included in the pulse divide signal SP2$^n$ corresponds to the half period of the clock divide signal CP2$^{n-1}$. A second sensing signal SP_OUT obtained by removing the influence of the switching time $2^n T_{SW}$ from the first divide signal CP2$^n$ by the RS flip flop 425 is outputted. Herein, the RS flip flop 425 may have any configuration for removing a pulse width corresponding to the half period of the clock divide signal CP2$^{n-1}$ from the pulse divide signal SP2$^n$. For example, the RS flip flop 425 may be configured with an RS latch including a combination circuit not synchronized with a clock.

The counter 426 may count the pulse length of the second sensing signal SP_OUT including only a pure sensing component and output it as a binary data string. A pulse count operation of the counter 426 is performed based on a basically provided clock signal CLK.

The D flip flop 427 inverts the first sensing signal SP1 in synchronization with a clock signal CLK. The inverted first sensing signal SP1 is inputted to the second NAND gate 428 together with a start signal Start. As a result, the switch 416 of the sensor unit 410 is controlled by an inverted and fed back first sensing signal SP1. However, since the first sensing signal SP1 includes a switching time, the influence of a switching time does not disappear after the feedback.

As above, the sensor device 400 amplifies the first sensing signal SP1 outputted from the sensor unit 410 and removes an unnecessary switching component included in the amplified pulse signal to output it as the second sensing signal SP_OUT. As the second sensing signal SP_OUT is counted, digital data in which only a sensing component is amplified purely may be generated. Herein, it is described that the sensor unit 410 includes a resistance sensor of which resistance size is changed according to a sensing result. However, it is understood that the sensor unit 410 is configured with any sensor in a current mode ramp integrator form to provide a sensed signal in pulse form. Furthermore, the high-resolution ADCs 220 and 420 of FIGS. 2 and 5 have a simple structure and are suitable for miniaturization and low power consumption, so that they may be in a proper form to be implemented with a semiconductor chip.

Figure 6:
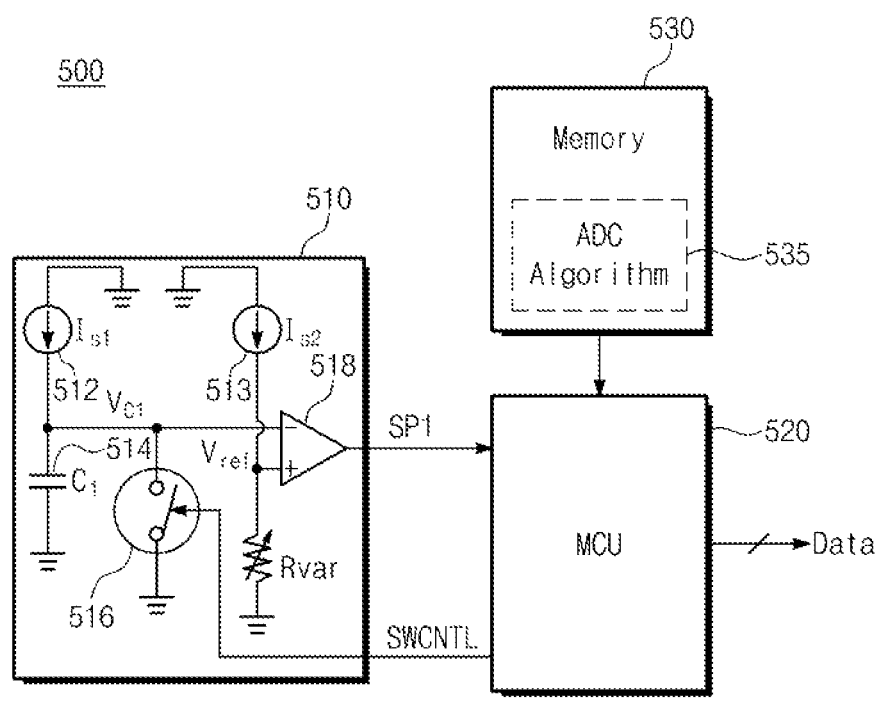
FIG. 6 is a block diagram illustrating a sensor device according to another embodiment of the present invention.

FIG. 6 is a block diagram illustrating a sensor device according to another embodiment of the present invention. Referring to FIG. 6, a sensor device 500 includes a sensor unit 510, an MCU 520, and a memory 530 including an ADC algorithm 535. Herein, it is understood that the memory 530 including the ADC algorithm 535 is an embedded memory included inside the MCU 520.

The sensor unit 510 is substantially identical to the sensor unit 410 shown in FIG. 5. The sensor unit 510 may include current sources 512 and 513, a charging capacitor 514, a switch 516, a comparator 518, and a variable resistor Rvar. The first current source 512 is provided for charging the charging capacitor 514. The second current source 513 provides a predetermined size of current $I_{S2}$ flowing in the variable resistor Rvar. Accordingly, when the size of the variable resistor Rvar is changed by physical and chemical sensing, as the size of the current $I_{S2}$ is maintained constantly, a reference voltage Vref is changed. A change of the reference voltage Vref is consequently sensed. Herein, the sizes $I_{S1}$ and $I_{S2}$ of currents respectively provided from current sources 512 and 513 may be provided identically. However, it is understood that the sizes $I_{S1}$ and $I_{S2}$ of currents have different values if necessary.

The charging capacitor 514 provides a fixed size of capacitance unlike the sensing capacitor 314 of FIG. 4. The charging capacitor 514 may be charged by the first current source $I_{S1}$.

Then, charges charged to the charging capacitor 514 are to be discharged by the switch 516. The length of a charging time may be set according to a capacitance of the charging capacitor 514.

The switch 516 may discharge the charging capacitor 414 in response to a switch control signal SWCNTL. That is, a capacitor voltage Vc is generated according to charging of the charging capacitor 514 and the switch 516 discharges the charging capacitor 514 periodically to initialize a capacitor voltage Vc. The comparator 518 compares a capacitor voltage Vc outputted periodically by charging/discharging of the charging capacitor 514 with a reference voltage Vref. The capacitor voltage Vc is provided to a negative input terminal (−) of the comparator 518 and the reference voltage Vref is provided to a positive input terminal (+) of the comparator 518. Then, the comparator 518 outputs a comparison result as the first sensing signal SP1.

According to the above-mentioned configuration and function, the sensor unit 510 may be configured in a current mode ramp integrator form. That is, the charging capacitor 514 is charged by a predetermined size of current $I_{s1}$ and discharged by the switch 516. Then, the rise and discharge pattern of the capacitor voltage Vc are changed by a change of a reference voltage Vref caused by a size change of the variable resistor Rvar. Such a sensing result may be outputted as the pulse of the first sensing signal SP1. The first sensing signal SP1 in pulse form is provided to the MCU 520.

The MCU 520 converts a first sensing signal SP1 provided from the sensor unit 510 into digital data Data. The MCU 520 may generate a switch control signal SWCNTL for controlling charging/discharging of the sensor unit 520 by referring to the period of a clock signal CLK. The MCU 520 performs a function of the high-resolution ADCs 220 and 420 described with reference to FIGS. 2 and 5. That is, the MCU 520 amplifies the period of the first sensing signal SP1 target times $2^n$. Then, the MCU 520 amplifies the period of a clock signal CLK $2^{n-1}$ times. A switching component added by a sensing operation of the sensor unit 510 may be removed from such an amplified sensing signal SP2$^n$ by using the amplified clock signal CP2$^{n-1}$.

That is, the MCU 520 may drive an algorithm corresponding to general components of the high-resolution ADCs 220 and 420 described with reference to FIGS. 2 and 5. Such an algorithm may be provided through an embedded memory in the MCU 520. Alternatively, the ADC algorithm 535 for performing a function of the high-resolution ADCs 220 and 420 described with reference to FIG. 2 or 5 may be provided through the memory 530 such as flash memory or ROM connected to the outside of the MCU 520.

As mentioned above, the sensor devices 300 and 500 shown in FIGS. 4 and 6 may be configured variously through the MCUs 320 and 520. That is, the high-resolution ADCs 220 and 420 in chip form shown in FIGS. 2 and 5 may be implemented with a program in software form. Most of actual ADCs are connected to MCUs and used. In order to develop high-resolution ADCs, it may take a lot of time and high costs to develop new chips that implement the high-resolution ADCs. However, in some cases, analog parts such as the sensor units 310 and 510 may be manufactured with chips and functions of the high-resolution ADCs 220 and 420 may be executed with firmware or logic programs. Additionally, the ADC algorithms 335 and 535 in firmware form to be downloaded into the MCUs 320 and 520 may be implemented with digital codes such as HDL (for example, Verilog, VHDL, C language, and so on) and also may be implemented using FPGA.

The MCUs 320 and 520 may be changed or adjusted variously by the ADC algorithms 335 and 535 provided as firmware. Furthermore, a clock CLK used for the MCUs 320 and 520 may be supplied from the inside or outside of chips of the MCUs 320 and 520. As a result, the present invention may configure the sensor units 310 and 510 including a current mode ramp integrator by using hardware and may configure the remaining by programmable chips (for example, MCU, FPGA, and so on) in order to configure an ADC in a form that an application system requires. The ADC algorithm 335 or the ADC algorithm 535 may be substantially provided in a form in which at least one software module is combined.

Figure 7:
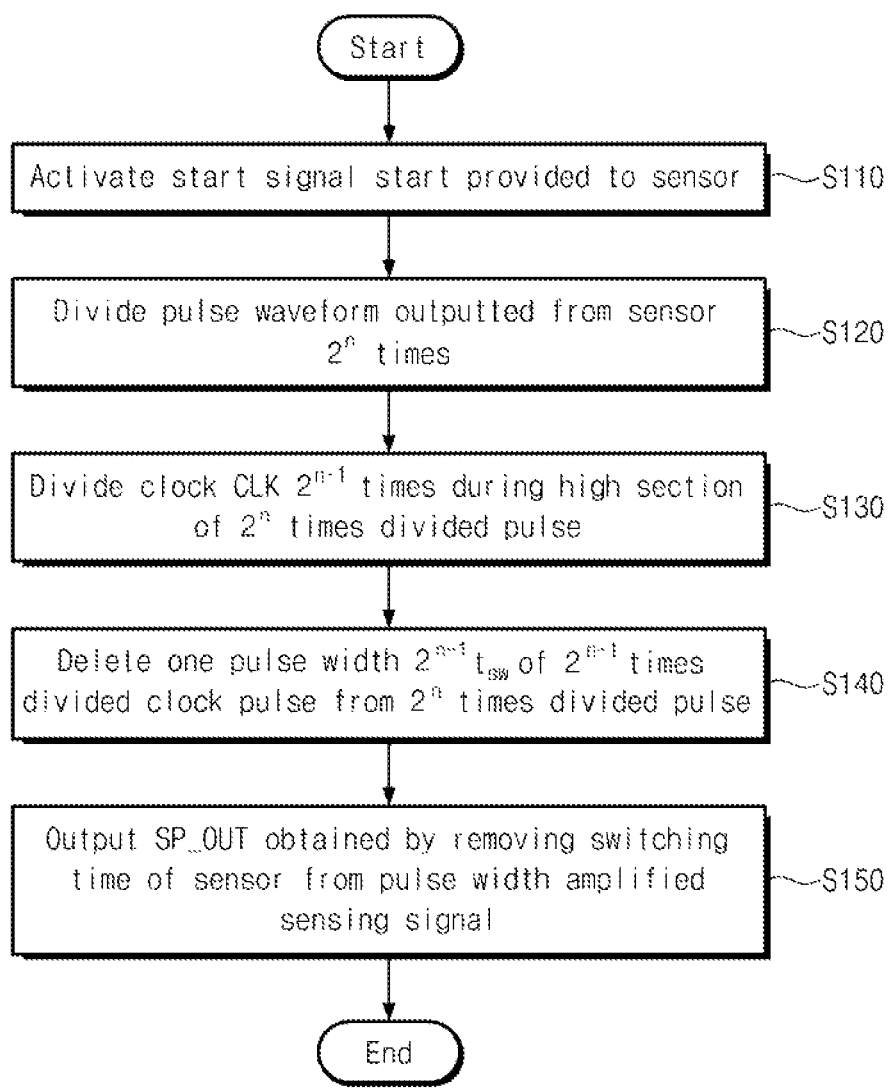
FIG. 7 is a flowchart illustrating an operation method of an ADC algorithm operating in an MCU in FIG. 5 or 6.

FIG. 7 is a flowchart illustrating an operation method of an ADC algorithm operating in an MCU in FIG. 4 or 6. Referring to FIG. 7, an amplified switching component may be removed from a pulse width amplified sensing signal by the ADC algorithm 535 driven by the MCU 520. Herein, the advantages of the present invention will be described with reference to the MCU 520 of FIG. 6.

In operation S110, the MCU 520 activates a start signal Start to drive the sensor unit 510. Then, the switch control signal SWCNTL is delivered to the sensor unit 510. According to an activation period of the switch control signal SWCNTL, the charging capacitor 514 of the sensor unit 510 is charged and discharged periodically. Then, the capacitor voltage Vc rises at a predetermined slope and drops to 0 V at the time point that the switching 516 is turned on. Such a process is controlled by the switch control signal SWCNTL. Then, the sensor unit 510 outputs a first sensing signal SP1 in pulse form, which is outputted from the comparator 518.

In operation S120, the MCU 520 amplifies a first sensing signal SP1 $2^n$ times, which is provided from the sensor unit 510. That is, the MCU 520 generates a pulse divide signal $SP2^n$ by amplifying the period of the first sensing signal SP1 by a target amplification rate $2^n$.

In operation S130, the MCU 520 generates a clock signal CLK corresponding to one pulse section of the $2^n$ times divided pulse divide signal $SP2^n$. Then, a clock signal CLK in one pulse section of the pulse divide signal $SP2^n$ is amplified $2^{n-1}$ times corresponding to the half of the target amplification rate $2^n$ of the first sensing signal SP1.

In operation S140, the MCU 520 removes the $2^{n-1}$ times amplified clock divide signal $CP^{n-1}$ from the pulse divide signal $SP2^n$. That is, the MCU 520 removes a switching pulse component included in the $2^n$ times divided pulse signal $SP2^n$ by using a clock signal.

In operation S150, the MCU 520 removes a switching pulse component included in the pulse divide signal $SP2^n$ and outputs a second sensing signal SP_OUT generated according thereto. As the pulse length of the second sensing signal SP_OUT is counted, a purely amplified sensing signal is converted into digital data.

In the above, an operation procedure of the ADC algorithm 535 driven in the MCU 520 is described briefly. In general, outputs of the sensor unit 510 configured with an analog device and ADC circuit are provided to the MCU 520 or various DSPs in order for additional signal processing. However, rather than configuring an additional ADC circuit, it is more flexible to include a function of an ADC circuit in the MCU 520 in firmware form. Furthermore, a function of a high-resolution ADC may be provided through software in addition to reducing costs for an additional semiconductor chip.

Figure 8:
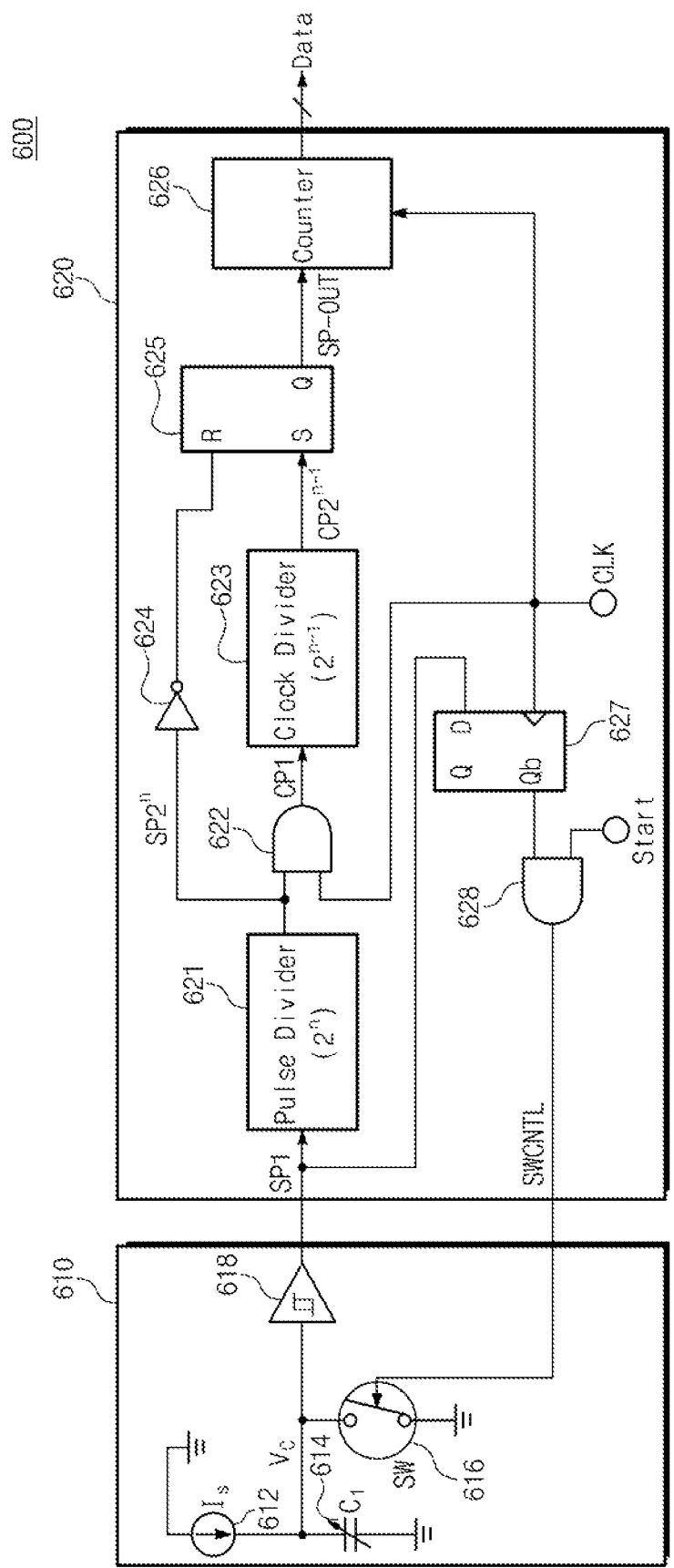
FIG. 8 is a block diagram illustrating a sensor device according to another embodiment of the present invention.

FIG. 8 is a block diagram illustrating a sensor device according to another embodiment of the present invention. Referring to FIG. 8, a sensor device 600 includes a sensor unit 610 and a high-resolution ADC 620.

The sensor unit 610 may include a current source 612, a sensing capacitor 614, a switch 616, and a buffer 618. The current source 612 may provide a predetermined level of charging current Is in order to charge the sensing capacitor 614. The sensing capacitor 614 may be charged by the charging current Is. Then, the sensing capacitor 614 may be discharged by the switch 616. The sensing capacitor 614 is provided as a variable capacitance. That is, the sensing capacitor 614 may be provided in a structure in which the size of a capacitance varies according to physical and chemical changes.

The switch 616 may discharge the sensing capacitor 614 in response to a switch control signal SWCNTL. That is, a change in a pattern of a capacitor voltage Vc according to charging of the sensing capacitor 614 is outputted as a sensing result and the switch 616 may initialize the capacitor voltage Vc by discharging the periodic sensing capacitor 614.

The buffer 618 may output a single input signal as a pulse signal without using a reference voltage Vref. Then, the buffer 618 outputs a first sensing signal SP1 according to a level of the capacitor voltage Vc. For example, when a level of the capacitor voltage Vc is lower than a lower limit threshold, the buffer 618 outputs the first sensing signal SP1 as a level of logic '0'. On the other hand, when a level of the capacitor voltage Vc is higher than an upper limit threshold, the buffer 618 outputs the first sensing signal SP1 as a level of logic '1'. When the buffer 618 is used, the complexity of a circuit configuration according to the use of a reference voltage Vref may be resolved.

According to the above-mentioned configuration and function, the sensor unit 610 may be configured in a current mode ramp integrator form. That is, the sensing capacitor 614 is charged by a predetermined size of current Is and discharged by the switch 616. Then, the rise and discharging pattern of the capacitor voltage Vc are changed according to a capacitance change of the sensing capacitor 614 and such a sensing result is to be outputted as the pulse width of the first sensing signal SP1.

The high-resolution ADC 620 generates a switch control signal SWCNTL for controlling the sensing unit 610 by using a start signal Start and a clock signal CLK. The high-resolution ADC 620 amplifies the pulse width of the first sensing signal SP1 outputted as a sensing result of the sensor unit 610. Then, the high-resolution ADC 620 removes a pulse portion corresponding to a switching section generated by the switch 616, from the amplified pulse signal. In order for such an operation, the high-resolution ADC 620 may include a pulse divider 621, a first NAND gate 622, a clock divider 623, an inverter 624, an RS flip flop 625, a counter 626, a D flip flop 627, and a second NAND gate 628. The high-resolution ADC 620 may be configured substantially identical to the high-resolution ADC 220 of FIG. 2. Accordingly, detailed description for the high-resolution ADC 620 is omitted.

As above, the sensor device 600 amplifies the first sensing signal SP1 outputted from the sensor unit 610 and removes an unnecessary switching component included in the amplified signal to output it as the second sensing signal SP_OUT. As the second sensing signal SP_OUT is counted, only a pure sensing component of the first sensing signal SP1 may be amplified and outputted as digital data. Furthermore, as a comparator configuring the sensor unit 610 is provided to the buffer 618 simply, since it is unnecessary to use a reference voltage Vref, miniaturization and a low powered sensing operation are possible.

Figure 9:
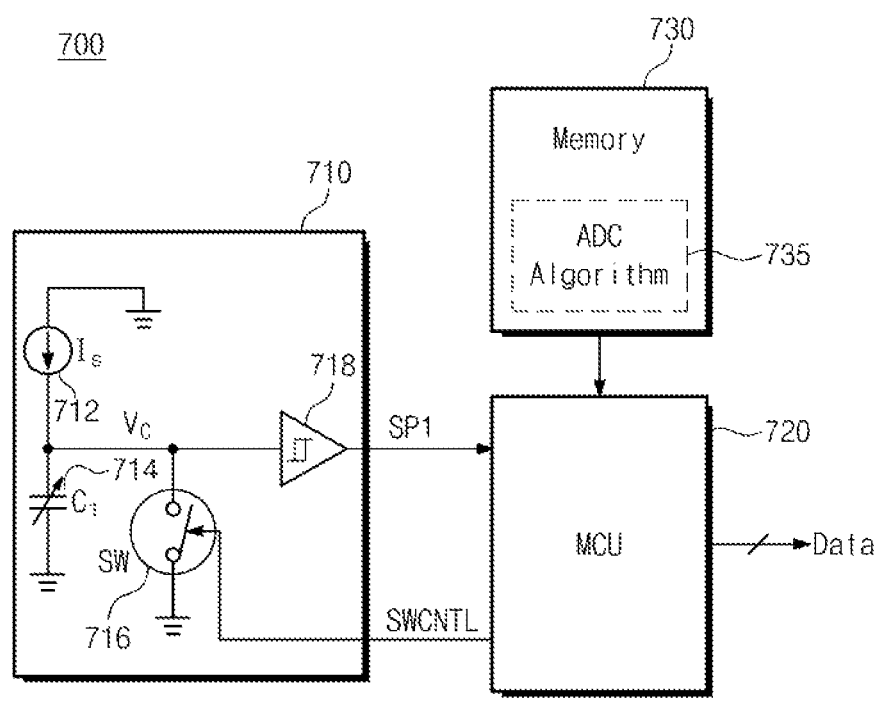
FIG. 9 is a block diagram illustrating a sensor device according to another embodiment of the present invention.

FIG. 9 is a block diagram illustrating a sensor device according to another embodiment of the present invention.

Referring to FIG. 9, a sensor device 700 includes a sensor unit 710 and an MCU 720 for performing a function of a high-resolution ADC 720.

The sensor unit 710 may include a current source 712, a sensing capacitor 714, a switch 716, and a buffer 718. The current source 712 may provide a predetermined level of charging current Is in order to charge the sensing capacitor 714. The sensing capacitor 714 may be charged by the charging current Is. Then, the sensing capacitor 714 may be discharged by the switch 716. The sensing capacitor 714 is provided as a variable capacitance. That is, the sensing capacitor 714 may be provided in a structure in which the size of a capacitance varies according to physical and chemical changes. A configuration of the sensor unit 710 is substantially identical to that of the sensor unit 610 shown in FIG. 8. Accordingly, detailed description for the sensor unit 710 is omitted.

The MCU 720 converts a first sensing signal SP1 provided from the sensor unit 710 into digital data Data. The MCU 720 may generate a switch control signal SWCNTL for controlling charging/discharging of the sensor unit 720 by referring to the period of a clock signal CLK. The MCU 720 performs a function of the high-resolution ADC 620 described with reference to FIG. 8. That is, the MCU 720 amplifies the period of the first sensing signal SP1 target times $2^n$. Then, the MCU 720 amplifies the period of a clock signal CLK $2^{n-1}$ times. A switching component from the sensor unit 710 may be removed by removing the clock divide signal $CP2^{n-1}$ amplified from the amplified pulse divide signal $SP2^n$.

The MCU 720 may drive the ADC algorithm 735 corresponding to general components of the high-resolution ADC 620 of FIG. 8. Such an algorithm may be stored in an embedded memory in the MCU 720 and then provided to the MCU 720. Alternatively, the ADC algorithm 735 may be provided through a nonvolatile memory 730 connected to the outside of the MCU 720.

As above, the sensor device 700 may include the sensor unit 710 that does not use a reference voltage Vref and the MCU 720 for performing a function of a high-resolution ADC 720 through software. When a function of a high-resolution ADC is configured with software such as firmware, it is effortless to update an amplification rate or various functions at low costs. Furthermore, a current mode ramp integrator may be configured with a simple configuration of the sensor unit 710.

Figure 10A:
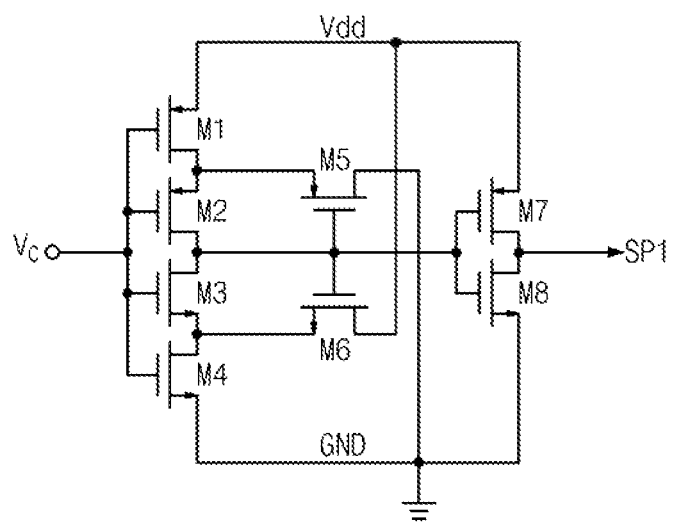
FIGS. 10A, 10B, 10C, and 10D are circuit diagrams illustrating a configuration of a buffer of FIG. 8 or 9.

FIGS. 10A, 10B, 10C, and 10D are circuit diagrams illustrating a form of a buffer of FIG. 8 or 9. Referring to FIG. 10A, a Schmitt trigger type buffer 718a is shown. The Schmitt trigger type buffer 718a is a buffer having hysteresis characteristics for an input signal Vc. The Schmitt trigger type buffer 718a determines logic of the first sensing signal SP1 on the basis of two threshold voltages VIH & VIL with respect to one input voltage Vc. For example, when a level of the input voltage Vc is higher than the upper limit threshold voltage VIH in a rise section of the input voltage Vc, the first sensing signal SP1 shifts to logic '1'. On the other hand, when a level of the input voltage Vc is lower than the lower limit threshold voltage VIL in a drop section of the input voltage Vc, the first sensing signal SP1 shifts to logic '0'. Accordingly, noise for the input voltage Vc between the two threshold voltages VIH and VIL due to hysteresis characteristics does not occur in the output voltage SP1 of the Schmitt trigger type buffer 718a.

Figure 10B:
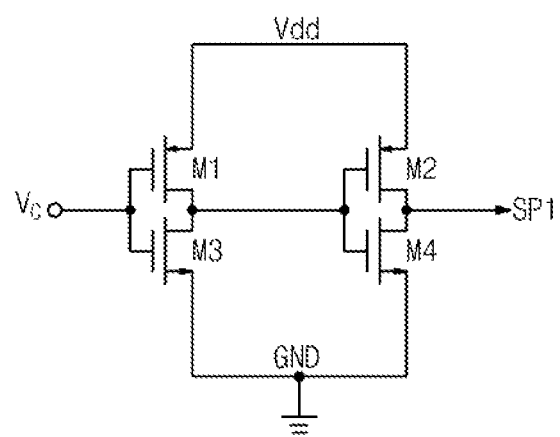
Figure 10C:
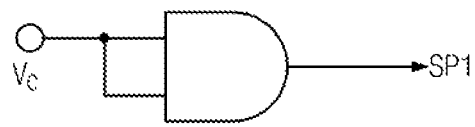
Figure 10C:
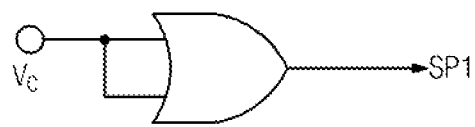
Figure 10D:
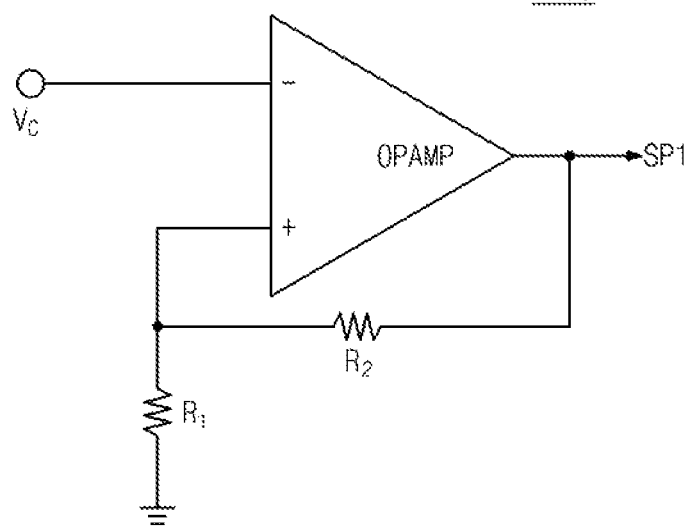

Referring to FIG. 10B, a buffer 718b connecting two inverters in series is shown. The buffer 718b may provide a first sensing signal SP1 without hysteresis characteristics for the input voltage Vc. FIG. 10C illustrates various logic gates for providing a buffer function. A buffer 718c commonly applies an input voltage Vc to an input terminal of a NAND gate NAND to generate a first sensing signal SP1 and a buffer 718d commonly applies an input voltage Vc to an input terminal of a NOR gate NOR to generate a first sensing signal SP1. FIG. 10D illustrates a buffer circuit using an operational amplifier OPAMP.

As shown in FIGS. 10A to 10D, a simplified buffer of one input one output type may be used as an output terminal of the sensor unit 710. Accordingly, the sensor unit 710 may not use a configuration (for example, a bandgap reference voltage generator) for providing a reference voltage Vref.

Figure 11A:
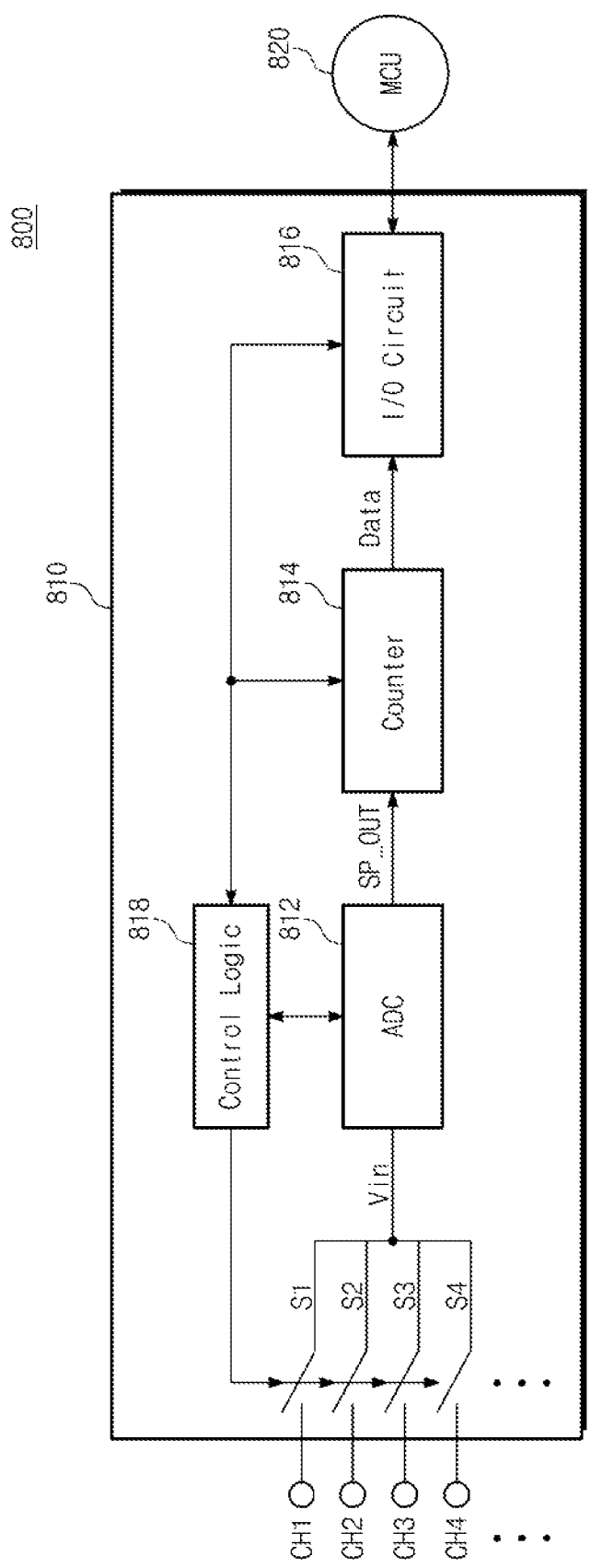
FIGS. 11A to 11C are block diagrams illustrating a sensor device having a plurality of channels.
Figure 11B:
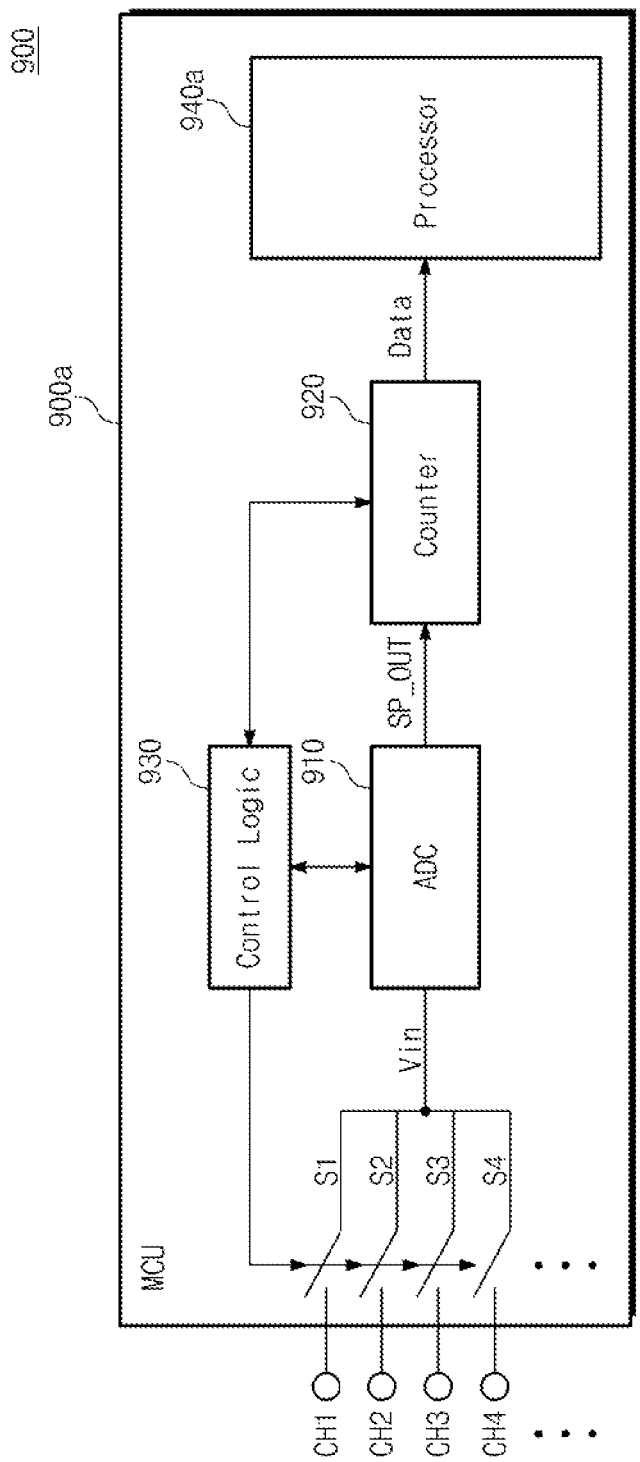
Figure 11C:
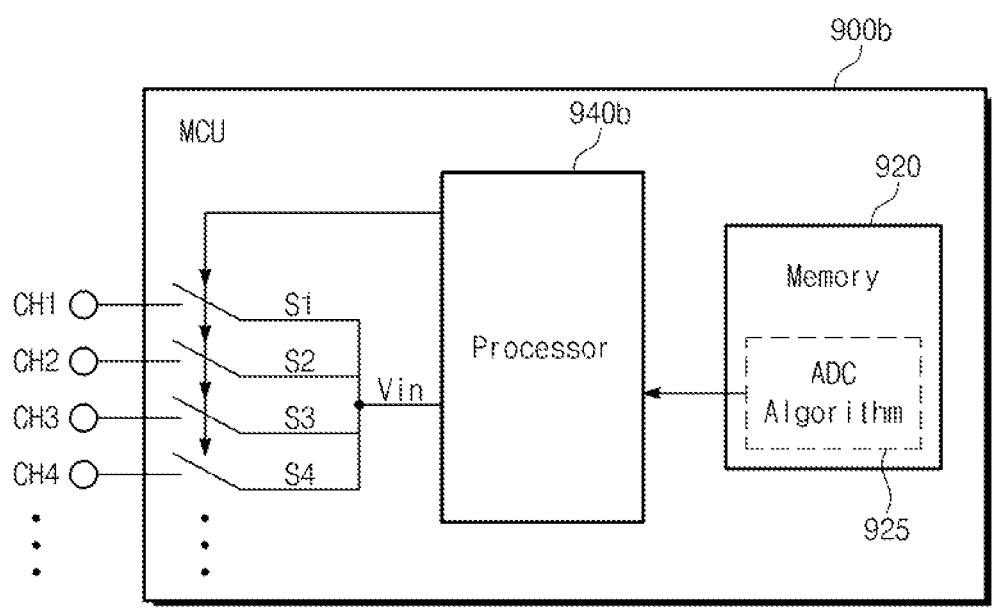

FIGS. 11A to 11C are block diagrams illustrating sensor devices having a plurality of channels. FIG. 11A illustrates an example that a high-resolution ADC is configured with hardware such as a semiconductor chip and FIG. 11B illustrates an example that a high-resolution ADC is embedded in an MCU as hardware. Then, FIG. 11C illustrates an example that a high-resolution ADC is implemented by software driven in an MCU.

Referring to FIG. 11A, provided is a high-resolution ADC 810 for selecting a sensing signal of a plurality of channels to perform pulse width amplification, removing a switching component from the amplified signal to convert the signal into digital data, and providing the digital data to the MCU 820. The high-resolution ADC 810 may be provided as a device separated from the MCU 810. Accordingly, an additional input/output circuit 816 for interfacing with the MCU 820 is supposed to be included.

Herein, a plurality of channels CH1, CH2, CH3, and CH4 respectively correspond to different types of sensing signals. For example, a pulse signal that senses temperature may be provided to the channel CH1, a pulse signal that senses humidity may be provided to the channel CH2, a pulse signal that measures acceleration may be provided to the channel CH3, and a pulse signal that senses various physical and chemical conditions may be provided to the channel CH4. Then, in order to provide one channel signal among the channels CH1, CH2, CH3, and CH4 as an input signal Vin, the control logic 818 may turn on only one of a plurality of switches S1, S2, S3, and S4. Then, the selected sensing signal is amplified by the ADC 812 and a switching component is removed from the amplified signal, and then an output signal SP_OUT in pulse waveform is to be outputted. Then, when the counter 814 counts a pulse length and output it as data Data, the input/output circuit 816 may deliver the data to the MCU 820 according to a specific protocol. The input/output circuit 816 may use an interface of a protocol such as Inter-Integrated Circuit (I²C) and Serial-Peripheral Interface (SPI).

Referring to FIG. 11B, provided is an MCU 900b for selecting a sensing signal of a plurality of channels to perform pulse width amplification, and removing a switching component from the amplified signal to convert the signal into digital data. Herein, the high-resolution ADC 910 may be implemented with hardware but may be included inside the MCU 900a. In this case, an additional interface for delivering a sensing result converted into digital data to the MCU 900a may be removed. The MCU 900a may include a high-resolution ADC 910, a counter 920 for converting a sensing signal SP_OUT into sensing data Data, and a control logic 930 for controlling those operations and selecting a channel.

Referring to FIG. 11C, a function of the high-resolution ADC 910 of FIG. 11B is provided as software such as an ADC algorithm 925 executed in the MCU 900b. The MCU 900b may select one channel by controlling the switches S1, S2, S3, and S4 for selecting a sensing signal of a plurality of channels. A signal of the selected channel is delivered as an input signal Vin to the processor 940b. The processor 940b may amplify a signal to high-resolution by executing the ADC algorithm 925 loaded from the memory 920 and remove a switching time from the amplified signal. Herein, the memory 920 may be an embedded memory inside the MCU 900b or a memory equipped outside the MCU 900b.

In the above, functions of sensor devices for selecting and processing one among sensing signals of a plurality of channel are described. Herein, a sensor device may be built in an MCU and may be configured with a chip separated from an MCU. Furthermore, a function of a high-resolution ADC may be provided as software such as firmware driven in an MCU.

Figure 12A:
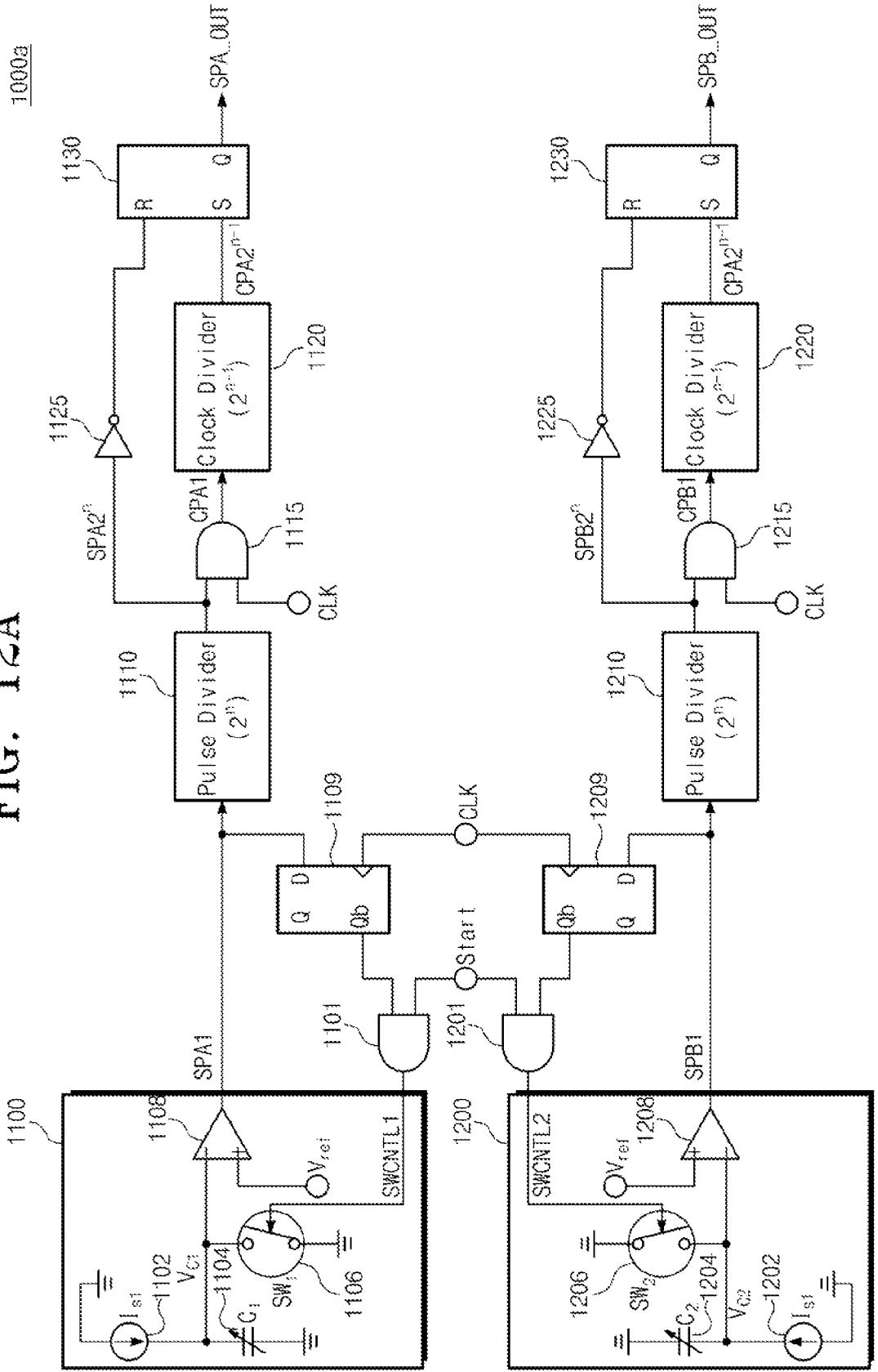
FIGS. 12A and 12B are block diagrams illustrating a differential ADC according to an embodiment of the present invention.
Figure 12B:
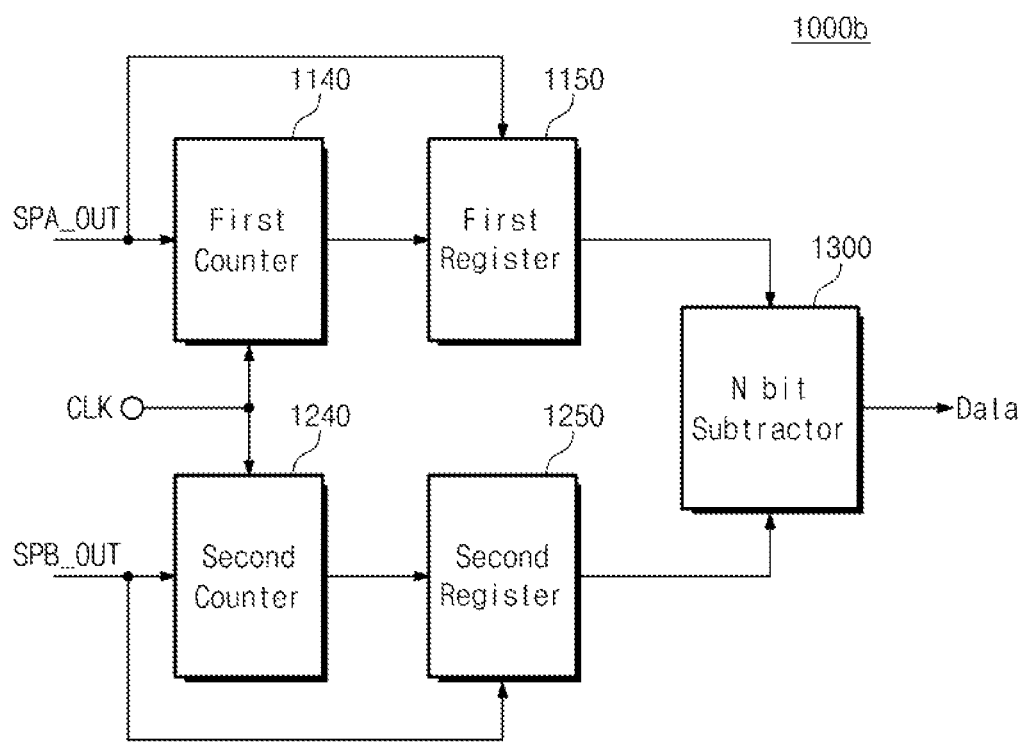

FIGS. 12A and 12B are block diagrams illustrating a differential sensor device according to an embodiment of the present invention. The implementation of a sensor device is possible in a differential system in which sensing is performed through two sensor units 1100 and 1200 and after a signal provided from each of the sensor units 1100 and 1200 is converted into digital data, subtraction is performed. A noise component commonly inputted through a differential sensor may be removed easily. Herein, FIG. 12A illustrates the first half 1000a of a differential sensor device 1000 and FIG. 12B illustrates the latter part configuration of the differential sensor device 1000. Accordingly, it is apparent to those skilled in the art that the differential sensor device 1000 shown in FIGS. 12A and 12B is not a separate configuration and is one configuration.

A first sensor unit 1100 may include a first current source 1102, a first sensing capacitor 1104, a first switch 1106, and a first comparator 1108. The first current source 1102 may provide a predetermined level of first charging current $I_{s1}$ in order to charge the first sensing capacitor 1104. The first sensing capacitor 1104 may be charged by the first charging current $I_{s1}$. Then, the first sensing capacitor 1104 may be discharged by the first switch 1106. The first sensing capacitor 1104 is provided as a variable capacitance. That is, the first sensing capacitor 1104 may be provided in a structure in which the size of a capacitance varies according to physical and chemical changes.

The first switch 1106 may discharge the first sensing capacitor 1104 in response to a switch control signal SWCNTL1. That is, a change in a pattern of a capacitor voltage Vc according to charging of the first sensing capacitor 1104 is outputted as a sensing result and the first switch 1106 may initialize the capacitor voltage Vc by discharging the periodic sensing capacitor 1104. The first comparator 1108 compares a first capacitor voltage Vc1 outputted by periodic charging/discharging with a reference voltage Vref. The capacitor voltage Vc is provided to a negative input terminal (−) of the first comparator 1108 and the reference voltage Vref is provided to a positive input terminal (+) of the first comparator 1108. Then, the first comparator 1108 outputs a comparison result as the sensing signal SPA1.

The second sensor unit 1200 is configured identical the first sensor unit 1100. The second sensor unit 1200 may include a second current source 1202, a second sensing capacitor 1204, a second switch 1206, and a second comparator 1208. The second current source 1202 may provide a second charging current $I_{s2}$ in order to charge the second sensing capacitor 1204. Herein, the first sensing capacitor 1204, the second charging current $I_{s2}$, and the reference voltage Vref may be configured substantially identical to those of the first sensor unit 1100.

The second switch 1206 may discharge the second sensing capacitor 1204 in response to a switch control signal SWCNTL2. That is, a change in a pattern of a capacitor voltage Vc2 according to charging of the second sensing capacitor 1204 is outputted as a sensing result and the second switch 1206 may initialize the capacitor voltage Vc2 by periodically discharging the second sensing capacitor 1204. The second comparator 1208 compares a second capacitor voltage Vc2 outputted by periodic charging/discharging with a reference voltage Vref. The second capacitor voltage Vc2 is provided to a negative input terminal (−) of the second comparator 1208 and the reference voltage Vref is provided to a positive input terminal (+) of the second comparator 1208. Then, the second comparator 1208 outputs a comparison result as the sensing signal SPB1.

Functions of a high-resolution ADC for the sensing signals SPA1 and SPB1 provided from the first sensor unit 1100 and the second sensor unit 1200 may be configured substantially identical to those of the high-resolution ADC 220 of FIG. 2. That is, in order to perform amplification on the sensing signal SPA1 and remove a switching time from the amplified signal, a pulse divider 1110, a NAND gate 1115, a clock divider 1120, an inverter 1125, and an RS flip flop 1130 may be used. An amplified sensing signal SPA_OUT of which switching time is removed may be outputted by the RS flip flop 1130.

In order to perform amplification on the sensing signal SPA1 and remove a switching time from the amplified signal, a pulse divider 1210, a NAND gate 1215, a clock divider 1220, an inverter 1225, and an RS flip flop 1230 may be used. An amplified sensing signal SPB_OUT of which switching time is removed may be outputted by the RS flip flop 1230.

Herein, the NAND gates 1101 and 1201 and the D flip flops 1109 and 1209, as configurations for providing the switching control signals SWCNTL1 and SWCNTL2 to the first sensor unit 1100 and the second sensor unit, respectively, may be activated in response to a start signal Start. Then, if they are activated, the switching control signals SWCNTL1 and SWCNTL2 are synchronized with a clock signal CLK to control the switches 1106 and 1206 of the first sensor unit 1100 and the second sensor unit 1200.

FIG. 12B is a block diagram illustrating the latter part 1110b of the ADC 1000. Referring to FIG. 12B, sensing signals SPA_OUT and SPB_OUT containing information in a pulse width are converted into digital data by counters 1140 and 1240, respectively. That is, the size of a pulse width is counted, outputted as data containing sensing information, and stored in registers 1150 and 1250. Then, data stored in the first register 1150 and the second register 1250 is processed by an N-bit subtractor 1300. As a result, a common mode noise included in each of the two amplified sensing signals SPA_OUT and SPB_OUT where a switching time is removed may be removed.

Figure 13A:
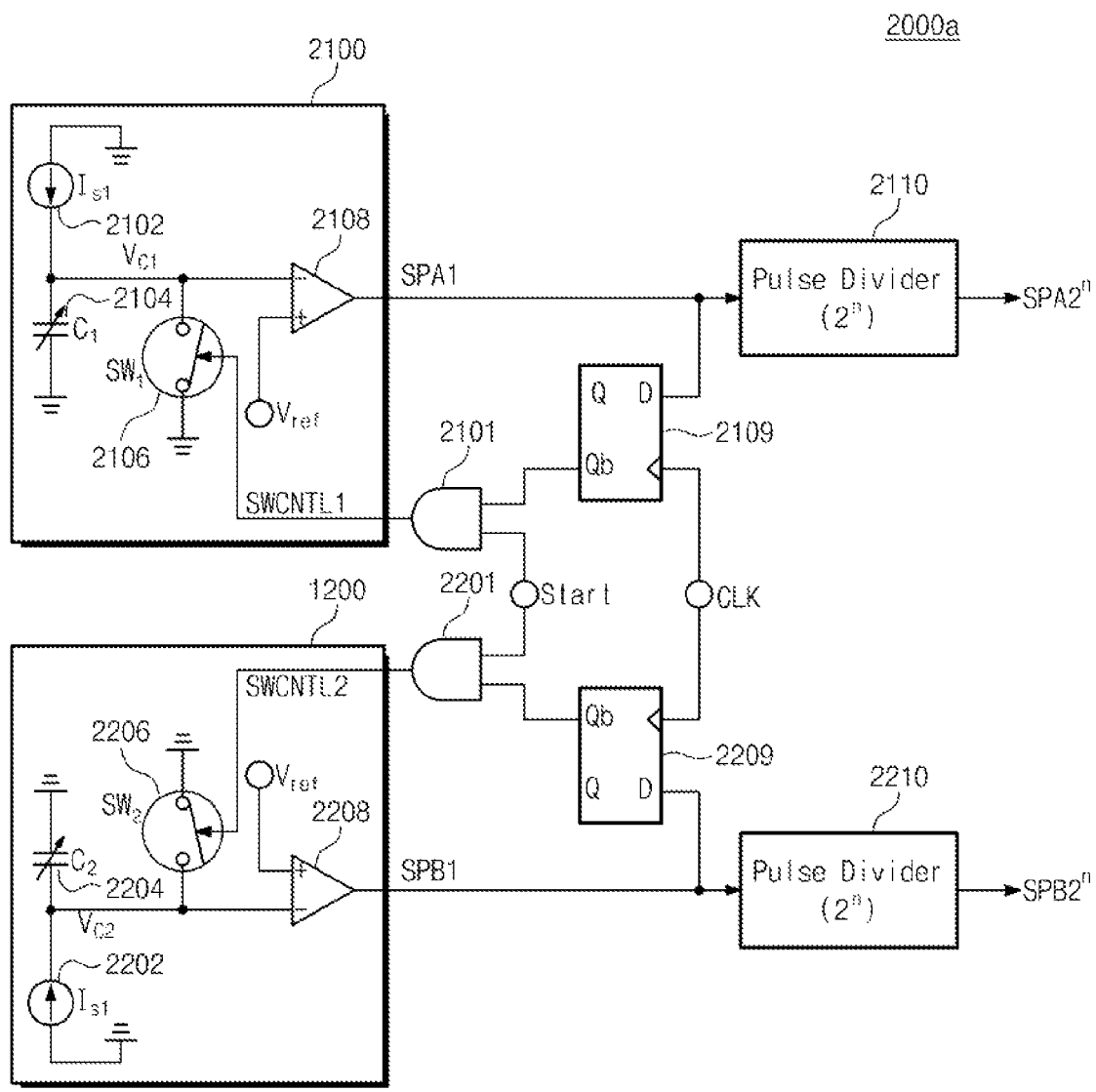
FIGS. 13A and 13B are block diagrams illustrating a differential sensor device according to another embodiment of the present invention.
Figure 13B:
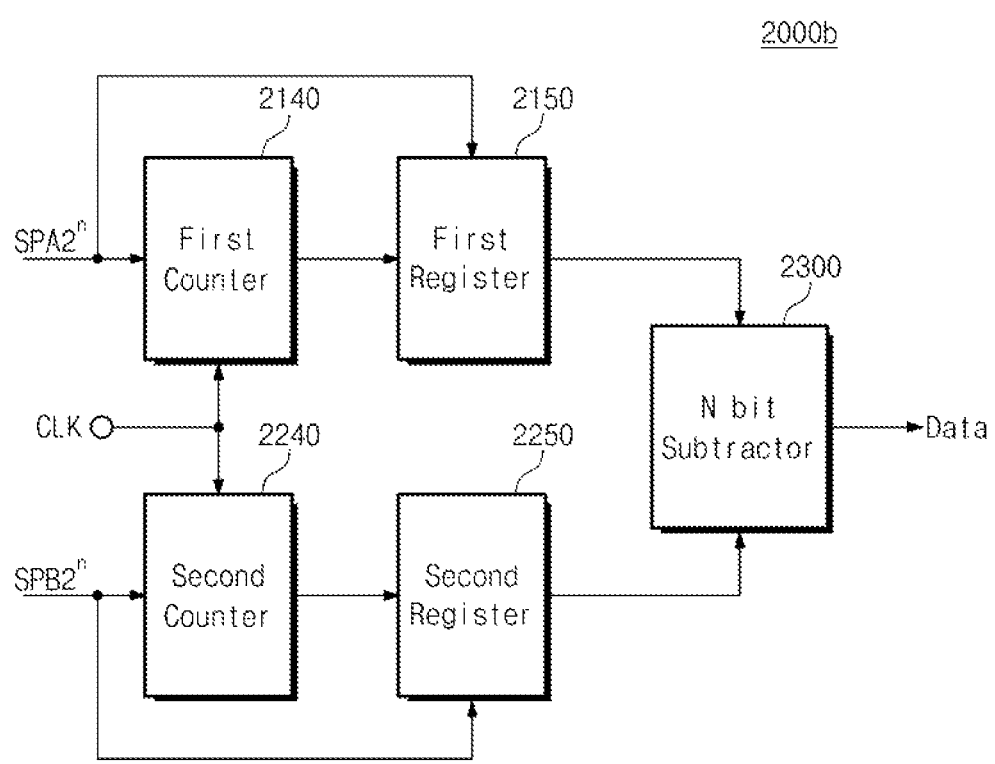

FIGS. 13A and 13B are block diagrams illustrating a differential sensor device according to an embodiment of the present invention. Referring to FIG. 13A, even when a clock dividing function is removed from the differential sensor device 1000a of FIG. 12A, functions of a high-resolution differential ADC may be performed. That is, a differential sensor device 2000a where the NAND gates 1115 and 1215, the clock dividers 1120 and 1220, the inverters 1125 and 1225, and the RS flip flops 1130 and 1230 are removed from the differential sensor device 1000a of FIG. 12A is shown in FIG. 13A. As a result, the removal effect of a switching time may be reduced but such a form may provide an effective filtering function for noise in common mode.

FIG. 13B illustrates a configuration that is substantially identical to the latter part configuration 1000b of the differential ADC 1000 of FIG. 12B. However, there is only a difference in that inputted signals are amplified signals SPA2″ and SPB2″ where no switching time is removed. Accordingly, detailed description for the configuration of FIG. 13B is omitted.

FIG. 14 is a timing diagram illustrating an operation of the differential sensor device 1000a of FIG. 12A. Referring to FIG. 14, the first sensor unit 1100 and the second sensor unit 1200 may start sensing in response to the same clock signal CLK and start signal Start. Then, the capacitor voltages Vc1 and Vc2 are formed according to charging and discharging of the periodic sensing capacitors C1 and C2 and the sensing signals SPA1 and SPB1 are outputted by the comparators 1108 and 1208. Then, a pulse width amplification is performed on the sensing signals SPA1 and SPB1 by the pulse dividers 1110 and 1210 and the amplified sensing signals SPA2″ and SPB2″ are generated. Then, when clock division by the clock dividers 1120 and 1220 and the removal of a switching time by the RS flip flops 1130 and 1280 are performed, the amplified sensing signals SPA_OUT and SPB_OUT are outputted.

Counting and differential operations for the amplified sensing signals SPA_OUT and SPB_OUT are not shown in the timing diagram. However, effective filtering for noise is possible by a function of a differential ADC for performing the above-mentioned sensing and pulse width amplification.

According to an embodiment of the present invention, an ADC for reducing power consumption and a sensor device including the same may be implemented. According to an embodiment of the present invention, a high-resolution ADC and a sensor device including the same are provided. According to an embodiment of the present invention, an ADC for minimizing a chip area and a sensor device including the same may be provided.

Accordingly, a high-performance ADC and a sensor device may be provided for a mobile device or a field requiring low power consumption such as IoT.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A sensor device comprising:
a sensor unit converting a voltage of a periodically switched capacitor into a pulse signal by referring to a clock signal to provide the pulse signal as a first sensing signal; and
a high-resolution analog to digital converter (ADC) amplifying a period of the first sensing signal $2^n$ times (n is an integer), amplifying a period of the clock signal $2^{n-1}$ times, and generating a second sensing signal where a switching time of the capacitor is removed by removing the amplified clock signal from the amplified first sensing signal.

2. The sensor device of claim 1, wherein the sensor unit comprises:
a first current source providing a charging current for charging the capacitor;
a switch discharging the capacitor according to a switch control signal provided from the high-resolution ADC; and
a comparator comparing the voltage of the capacitor with a reference voltage to output a comparison result as the first sensing signal.

3. The sensor device of claim 2, wherein the capacitor comprises a variable capacitance capacitor varying according to an external physical/chemical change.

4. The sensor device of claim 2, wherein the sensor unit comprises:
a second current source providing the reference voltage; and
a variable resistor providing the reference voltage according to a current provided from the second current source,
wherein the capacitor is provided as a fixed capacitance capacitor and the variable resistor varies according to an external physical/chemical change.

5. The sensor device of claim 1, wherein the sensor unit comprises a current mode ramp integrator converting a capacitor voltage generated when charging and discharging the capacitor with a reference current into a pulse signal.

6. The sensor device of claim 1, wherein the high-resolution ADC comprises:
a pulse divider outputting the first sensing signal amplified by dividing the first sensing signal $2^n$ times (n is an integer);
a clock divider generating a clock signal amplified by dividing a pulse width of the clock signal $2^{n-1}$ times; and
a signal subtractor removing a switching time from the amplified first sensing signal by using the amplified clock signal.

7. The sensor device of claim 6, further comprising a NAND gate performing AND operation on the amplified first sensing signal and the clock signal to provide an AND operation result to the clock divider.

8. The sensor device of claim 6, wherein the signal subtractor comprises an RS flip flop having a set input terminal receiving the amplified clock signal and a reset input terminal receiving the amplified inverted first sensing signal.

9. The sensor device of claim 6, further comprising a counter counting a pulse width of a second sensing signal where a switching time outputted from the signal subtractor is removed to output the counted pulse width as sensing data.

10. The sensor device of claim 6, further comprising:
a D flip flop storing the first sensing signal in synchronization with a rising edge of the clock signal; and
a NAND gate performing AND operation on a negative output terminal of the D flip flop and a start signal to provide an AND operation result as the switch control signal.

11. The sensor device of claim 1, wherein the sensor unit comprises:
a first current source providing a charging current for charging the capacitor;
a switch discharging the capacitor according to a switch control signal provided from the high-resolution ADC; and
a buffer outputting the voltage of the capacitor as the first sensing signal that is a pulse signal.

12. A sensor device comprising:
a first sensor unit periodically charging and discharging a first capacitor by referring to a clock signal and converting a voltage of the first capacitor into a pulse signal to provide the pulse signal as a first sensing signal;
a second sensor unit periodically charging and discharging a second capacitor by referring to the clock signal and converting a voltage of the second capacitor into a pulse signal to provide the pulse signal as a second sensing signal;
a first high-resolution analog to digital converter (ADC) amplifying a pulse width of the first sensing signal specific times;

a second high-resolution ADC amplifying a pulse width of the second sensing signal the specific times;

a first counter converting an output of the first high-resolution ADC as first sensing data;

a second counter converting an output of the second high-resolution ADC as second sensing data; and a subtractor removing common mode data of the first sensing data and the second sensing data.

13. The sensor device of claim 12, further comprising:

a first clock divider amplifying a pulse width of the clock signal the half of the specific times to provide the amplified pulse width as a first clock signal;

a first RS flip flop removing a pulse width of the first clock signal from the amplified first sensing signal to provide a removal result to the first counter;

a second clock divider amplifying a pulse width of the clock signal the half of the specific times to provide the amplified pulse width as a second clock signal; and a second RS flip flop removing a pulse width of the second clock signal from the amplified second sensing signal to provide a removal result to the second counter.

14. A sensor device comprising:

a sensor unit periodically charging and discharging a capacitor by referring to a clock signal and converting a voltage of the capacitor into a pulse signal to provide the pulse signal as a first sensing signal; and a micro control unit performing a high-resolution analog to digital conversion function to amplify a pulse width of the first sensing signal target times, amplify a pulse width of the clock signal the half of the target times, and remove a component corresponding to a discharging time of the capacitor voltage by removing a pulse width of the half-target-times amplified clock signal from the target times amplified first sensing signal to output a removal result as a second sensing signal.

15. The sensor device of claim 14, wherein the sensor unit comprises:

a first current source providing a charging current for charging the capacitor;

a switch discharging the capacitor according to a switch control signal provided from the micro control unit; and a comparator comparing the voltage of the capacitor with a reference voltage to output a comparison result as the first sensing signal.

16. The sensor device of claim 15, wherein the capacitor comprises a variable capacitance capacitor.

17. The sensor device of claim 15, wherein the sensor unit comprises:

a second current source providing the reference voltage; and a variable resistor providing the reference voltage according to a current provided from the second current source, wherein the capacitor is provided as a fixed capacitance capacitor.

18. The sensor device of claim 14, wherein the sensor unit comprises a current mode ramp integrator converting a capacitor voltage generated when the capacitor is charged and displayed with a reference current into a pulse signal.

19. The sensor device of claim 14, further comprising a memory providing an algorithm performing the high-resolution analog to digital conversion function to the micro controller unit.

20. The sensor device of claim 14, wherein the sensor unit outputs different analog sensing signals through a plurality of channels; and the micro controller unit selects one of the plurality of channels and outputs the selected analog sensing signal as the sensing data.

* * * * *